United States Patent
Kitajima et al.

(10) Patent No.: US 10,088,513 B2
(45) Date of Patent: Oct. 2, 2018

(54) TRANSFORMER CONNECTION PHASE DETERMINATION DEVICE AND METHOD

(71) Applicant: FUJITSU LIMITED, Kawasaki-shi, Kanagawa (JP)

(72) Inventors: Hironobu Kitajima, Kawasaki (JP); Yuta Teranishi, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 247 days.

(21) Appl. No.: 14/847,061

(22) Filed: Sep. 8, 2015

(65) Prior Publication Data

US 2016/0091542 A1 Mar. 31, 2016

(30) Foreign Application Priority Data

Sep. 30, 2014 (JP) ................. 2014-201502

(51) Int. Cl.
*G01R 21/00* (2006.01)
*G01R 31/02* (2006.01)
*G01R 29/18* (2006.01)
*G01R 19/25* (2006.01)
*G01R 25/00* (2006.01)

(52) U.S. Cl.
CPC ........... *G01R 31/027* (2013.01); *G01R 29/18* (2013.01); *G01R 19/2513* (2013.01); *G01R 25/005* (2013.01)

(58) Field of Classification Search
CPC .................................................. G01R 31/027
USPC ......................................................... 702/60
See application file for complete search history.

(56) References Cited

U.S. PATENT DOCUMENTS 9,395,398 B2 * 7/2016 Kitajima ................ G01R 29/18
2007/0247139 A1 10/2007 Veroni et al.
2011/0130992 A1 6/2011 Kolwalker et al.
(Continued)

FOREIGN PATENT DOCUMENTS

JP 2003-174363 A 6/2003
JP 2008-510149 4/2008
(Continued)

OTHER PUBLICATIONS

Japanese Office Action dated Mar. 13, 2018 for corresponding Japanese Patent Application No. 2014-201502, with English Translation, 5 pages.

*Primary Examiner* — Anthony Ho
(74) *Attorney, Agent, or Firm* — Fujitsu Patent Center

(57) ABSTRACT

A transformer connection phase determination device includes a processor that executes a process. The process includes: acquiring a power value consumed by at least one consumer connected to a transformer that is connected to a phase corresponding to a combination of two of plural distribution lines, and acquiring respective current values flowing in the plural distribution lines; computing a frequency component of the power value or of a current value caused by the power value, and a frequency component of the respective current values flowing in the plural distribution lines; and computing respective correlation values indicating a correlation between the power value or the current value caused by the power value and the respective current values flowing in the plural distribution lines, using each of the computed frequency components, and determining the phase to which the transformer is connected based on the respective correlation values.

12 Claims, 10 Drawing Sheets

(56) References Cited

U.S. PATENT DOCUMENTS

| | | | |
|---|---|---|---|
| 2013/0035887 A1 | 2/2013 | Fan | |
| 2015/0094965 A1* | 4/2015 | Schneider | G01R 21/133 |
| | | | 702/58 |
| 2015/0134281 A1* | 5/2015 | Kitajima | G01R 21/133 |
| | | | 702/62 |
| 2015/0241490 A1* | 8/2015 | Kitajima | G01R 29/18 |
| | | | 324/76.77 |
| 2015/0377939 A1* | 12/2015 | Ishihara | G01R 29/18 |
| | | | 324/107 |
| 2016/0109491 A1* | 4/2016 | Kann | G01R 19/2506 |
| | | | 702/64 |

FOREIGN PATENT DOCUMENTS

| | | |
|---|---|---|
| JP | 2010-278492 A | 12/2010 |
| JP | 2011-123061 A | 6/2011 |
| JP | 2012-198033 | 10/2012 |
| JP | 2012-220383 A | 11/2012 |
| JP | 2013-050445 | 3/2013 |

\* cited by examiner

FIG.6

| CONSUMER ID | TRANSFORMER ID | POWER DISTRIBUTION SECTOR ID | DATA AVAILABILITY FLAG | CONNECTION PHASE |
|---|---|---|---|---|
| d1 | T1 | I1-2 | PRESENT | ab-PHASE |
| d2 | T2 | I1-2 | PRESENT | – |
| d3 | T2 | I1-2 | PRESENT | – |
| d4 | T2 | I1-2 | ABSENT | – |
| d5 | T3 | I1-3 | PRESENT | bc-PHASE |
| d6 | T3 | I1-3 | ABSENT | bc-PHASE |
| ... | ... | ... | ... | |

FIG.7

| CONSUMER ID | ... | DATE/0:00 | DATE/0:30 | DATE/1:00 | DATE/1:30 | ... |
|---|---|---|---|---|---|---|
| d1 | 0.50 | 0.53 | 0.60 | 0.65 | 0.42 | ... |
| d2 | 0.55 | 0.65 | 0.62 | 0.71 | 0.78 | ... |
| d3 | 0.60 | 0.51 | 0.44 | 0.40 | 0.37 | ... |
| ... | ... | ... | ... | ... | ... | ... |

FIG.8

| POWER DISTRIBUTION SECTOR ID | ... | DATE/0:00 | DATE/0:30 | DATE/1:00 | DATE/1:30 | ... |
|---|---|---|---|---|---|---|
| I1-2-a | 60 | 63 | 60 | 62 | 58 | ... |
| I1-2-b | 65 | 65 | 62 | 61 | 68 | ... |
| I1-2-c | 60 | 61 | 64 | 60 | 67 | ... |
| I1-3-a | 50 | 53 | 60 | 52 | 58 | ... |
| I1-3-b | 55 | 55 | 52 | 61 | 58 | ... |
| I1-3-c | 51 | 52 | 55 | 57 | 56 | ... |
| ... | ... | ... | ... | ... | ... | ... | ic # TRANSFORMER CONNECTION PHASE DETERMINATION DEVICE AND METHOD

CROSS-REFERENCE TO RELATED APPLICATION

This application is based upon and claims the benefit of priority of the prior Japanese Patent Application No. 2014-201502, filed on Sep. 30, 2014, the entire contents of which are incorporated herein by reference.

FIELD

The embodiments discussed herein are related to a transformer connection phase determination device, a transformer connection phase determination method, and a recording medium storing a transformer connection phase determination program.

BACKGROUND

Hitherto, as technology for determining the connection phase of a transformer, there has been a proposal for a phase distinguishing device that acquires measurement values of power breakers and sensor-containing partitioning switches through breaker substations, switching substations, and a power distribution monitoring and control master station, and acquires measurement values of smart meters through an automatic meter master station. The phase distinguishing device has power distribution system configuration data, power distribution transformer device data, and consumer supply equipment data stored in a data storage section. A time segment is selected that is a period out of each the measurement periods of measurement values, for employment in distinguishing the connection phase, and then the connection phase of each of the power distribution convertors is distinguished based on each of the measurement values measured in the selected time segment, and based on each of the items of data stored in the data storage section.

Related Patent Documents

Japanese Laid-Open Publication No. 2012-198033

SUMMARY

According to an aspect of the embodiments, a transformer connection phase determination device includes a processor configured to execute a process. The process includes: acquiring a power value consumed by at least one consumer connected to a transformer that is connected to a phase corresponding to a combination of two of plural distribution lines, and acquiring respective current values flowing in the plural distribution lines; computing a frequency component of the power value or of a current value caused by the power value, and a frequency component of the respective current values flowing in the plural distribution lines; and computing respective correlation values indicating a correlation between the power value or the current value caused by the power value and the respective current values flowing in the plural distribution lines, using each of the computed frequency components, and determining the phase to which the transformer is connected based on the respective correlation values.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of a power distribution data table;

FIG. 7 is a diagram illustrating an example of a power consumption data table;

FIG. 8 is a diagram illustrating an example of a line current data table;

DESCRIPTION OF EMBODIMENTS

Figure 1:
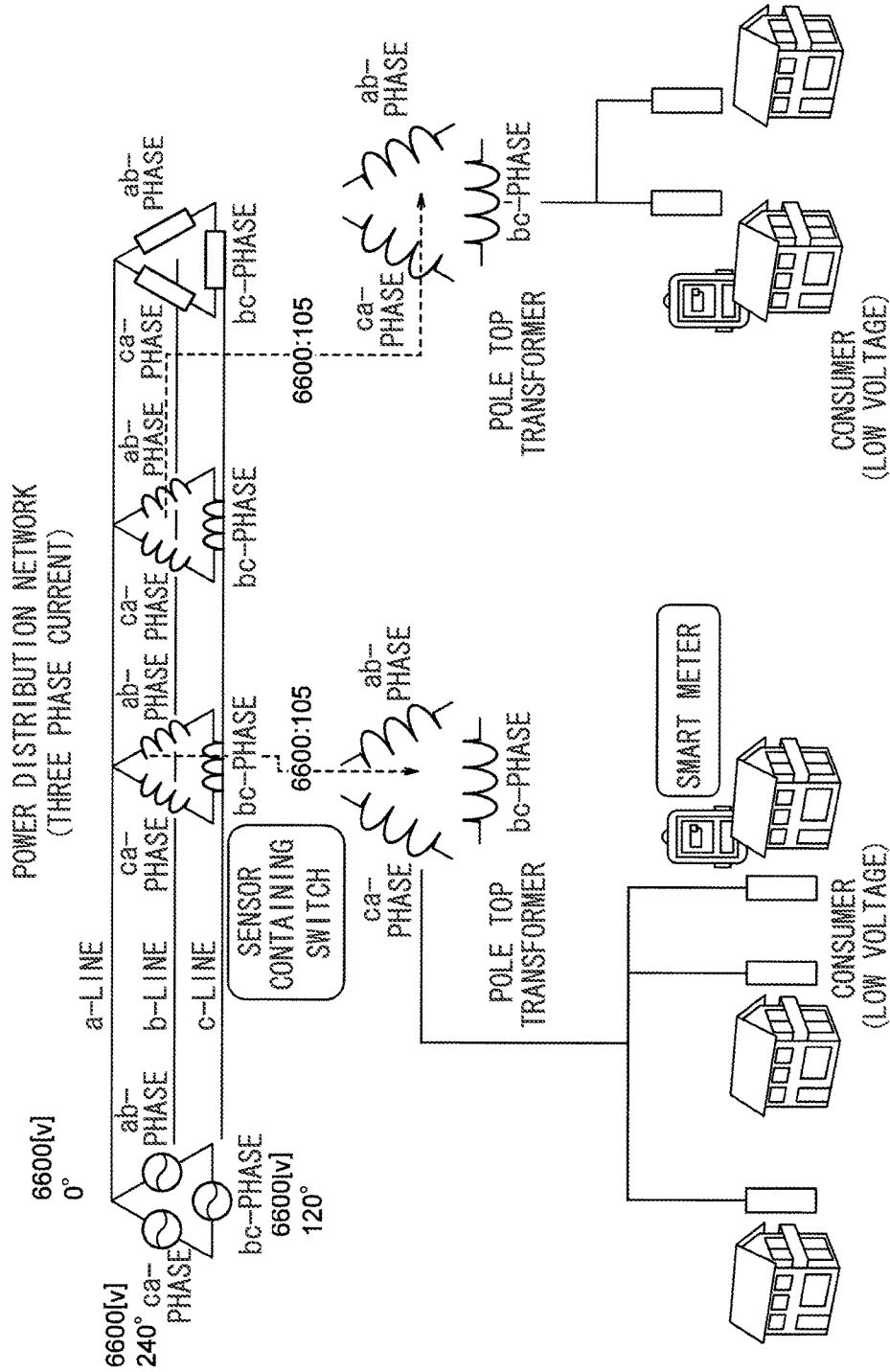
FIG. 1 is a schematic diagram illustrating an example of a power distribution network.

Detailed explanation follows regarding an exemplary embodiment according to technology disclosed herein, with reference to the drawings.

Regarding the Transformer Connection Phase Determination Problem With the opening up of the power supply market through deregulation of electricity businesses, and the proliferating trend towards renewable power, the functions required of power distribution systems acting as the power transfer means have recently been changing significantly. In such power distribution systems, there are significant issues regarding measures to address the expected large scale introduction of distributed power sources, such as solar power (photovoltaics (PV)). An example of such an issue is the need for voltage management to keep the supply voltage of power distribution systems within a fixed range (such as, for example, 101±6V, or 202±20V).

A major issue with voltage management in conventional power distribution systems is that voltage drops with excessive load; however, in distributed power source power distribution systems, since a reverse flow is generated to sell electricity, it is voltage rises that occur at such occasions that are a significant issue. Existing power distribution systems are designed and operated with the presumption of preventing voltage drops; however, issues related to voltage rises are hardly anticipated. The development of new voltage management methods, such as those utilizing various passive mechanisms and active mechanisms are being investigated in power electronics as countermeasures to such voltage rise issues.

An issue regarding the pole top transformer connection phase has surfaced during investigations into new voltage management methods. This issue is the problem, in a three phase power distribution system, of not knowing which phase the high voltage side of a given transformer at the consumer-side connection point is connected to out of the combination of 3 types of power distribution line (phases). The transformer connection phase is selected so as to achieve the best balance in load from plural consumers in order to maintain an equilibrium in three phase alternating current. However there are hardly any records held or management performed of specifically which transformer connection phase it is to which each consumer is connected. There is accordingly a need to start investigations into the application of new voltage management methods by surveying the current state of transformer connection phases.

Normally there is a single transformer installed for from 10 to 20 consumers, and if the power distribution system is considered as a whole then there are a vast number of transformers for which the connection phase needs to be determined. There is accordingly a large cost and time required if the transformer connection phases were manually determined for a whole power distribution system.

In conventional phase determination equipment technology there is a need for data regarding the power consumption of all of the consumers connected to the transformer, and it is not possible to determine the transformer connection phases if there is only usable data on electricity consumption for some of the consumers.

An object of the present exemplary embodiment is to determine the transformer connection phase even in situations in which there is only usable data on power consumption for some of the consumers connected to a transformer. More detailed explanation follows regarding the transformer connection phase determination problem underlying the present exemplary embodiment.

FIG. 1 illustrates an example of a power distribution network. In a three phase power distribution system there are 3 possibilities for the connection phase of the pole top transformer. The power distribution lines on the high voltage side (6.6 kV) are referred to here as a-line, b-line, and c-line, and possible combinations of power distribution lines for the transformer connection phase are an ab-phase, a bc-phase, and a ca-phase. Although most pole top transformers are actually single phase, the pole top transformer is illustrated with three phases to demonstrate that there plural possibilities for the connection phase. In an actual power distribution system, a transformer is normally limited to connection to a single phase, and operation is performed so as to allow load to be balanced across the three phases by allocating a given phase for each of the transformers.

At the high voltage side of the power distribution system, there are a number of sensor containing switches (SC) enabling measurement values to be acquired for the 3 types of line current and inter-line voltage. The consumer is connected to the secondary side of the transformer, and receives a contracted voltage (for example 100V). Power meters equipped with communication functions, such as smart meters, are being introduced to some consumers, and these continuously measure the power consumption in the consumers. Data of connection relationships between each consumer and transformer is managed by the power company; however, there are generally no records or management of data of the connection phase to which the transformer is connected.

The data of the transformer connection phase has importance for voltage management of the power distribution system; however, there is a large cost and time required to survey such data. Consideration has accordingly been given to determining the transformer connection phase based on the measurement data of the sensor containing switches and power meters on the consumer side. Specific conditions follow regarding "transformer connection phase determination problem".

The following are categories of data that can be used to determine transformer connection phases.
(1) measurement values of sensor containing switches
    line current on the high voltage side of the power distribution system (a-line, b-line, c-line)
    line voltage on the high voltage side of the power distribution system (between lines a-b, between lines b-c, and between lines c-a).
(2) measurement values of power meters with communication functions
    power consumption amount of consumer (only from the portion of the consumers who have installed power meters with communication functions).
(3) consumer management data
    connection relationships between each consumer and transformer (transformer connection phase unclear).

The Sensor containing switches of (1) are being introduced in existing power distribution systems, and installing from 1 to several sensor containing switches for a single feeder is practical. A feeder is a portion of a power distribution system centered on a power distribution transformer station, and a single feeder in a city normally includes consumers of about 1000 houses. The uptake of communication function equipped power meters of (2) is currently 2% or less, as of February 2012; however, installation is expected to proceed rapidly from now. The sampling interval for measuring the amount of power with power meters differs between the various types of power meter, and is, for example, a 30 minute interval. Regarding (3), there are cases in which data of the transformer connection phase utilization is also contained in addition to the data of connection relationships. For example, the connection phases of power lines are normally limited to one per transformer.

As described above, determination of the transformer connection phase based on the currently usable data is the "transformer connection phase determination problem" underlying the present exemplary embodiment.

It is generally natural to use circuit logic computation as the basis for determining connection relationships of circuits, such as transformer connection phases, from electrical data of power distribution systems. However, in usable data above, there is a distinct lack of data for performing deterministic circuit calculations. It is accordingly difficult to determine the transformer connection phase by circuit logic computation based on usable data. Determining the transformer connection phase by utilizing statistical correlation data in the usable data might be considered as the next best approach.

Considering combinations of usable data at the high voltage side and the low voltage side (consumer side) of the power distribution system, employing power data to implement a correlation analysis method is conceivable. If there is power data, then direct measurement values are obtainable from both the high voltage side and the low voltage side. Assume that it is possible to calculate power for each of the individual power distribution lines on the high voltage side, and that the power distribution lines configuring the power supply path are unique for the connection phase of the transformer to which the consumer is connected. In such cases, it is possible to determine the transformer connection phase by implementing correlation analysis of time series data of power of individual power distribution lines, against time series data of power consumption of the consumer.

However, for example as illustrated in FIG. 1, it is fundamentally difficult (for reasons given later) to determine the transformer connection phase based on a correlation analysis method using power data for a power distribution system in which each of the pole top transformers is connected to one phase out of three phases in a three phase line system. Thus in the present exemplary embodiment, the transformer connection phase is determined by correlation analysis using current data rather than power data.

Figure 2:
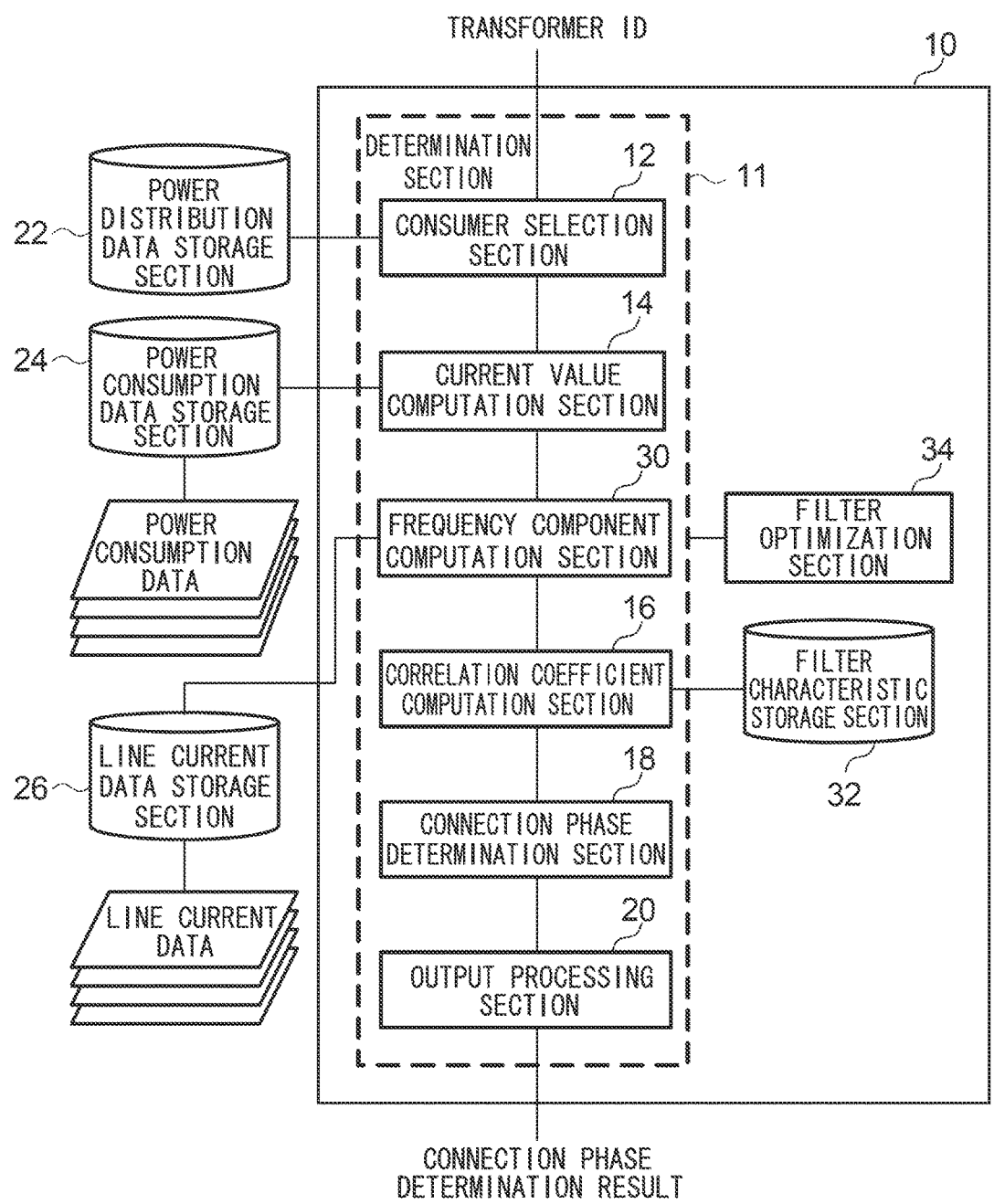
FIG. 2 is a block diagram representing a schematic configuration of a transformer connection phase determination device according to a first exemplary embodiment.

Configuration of Transformer Connection Phase Determination Device According to a First Exemplary Embodiment As illustrated in FIG. 2, the transformer connection phase determination device 10 according to the present exemplary embodiment includes a determination section 11 and a filter optimization section 34. The determination section 11 further includes a consumer selection section 12, a current value computation section 14, a frequency component calculation section 30, a correlation coefficient computation section 16, a connection phase determination section 18, and an output processing section 20.

The consumer selection section 12 receives as an input a transformer ID indicating the transformer for which connection phase determination is being performed, and selects a power distribution sector and consumer corresponding to the transformer ID.

Figure 3:
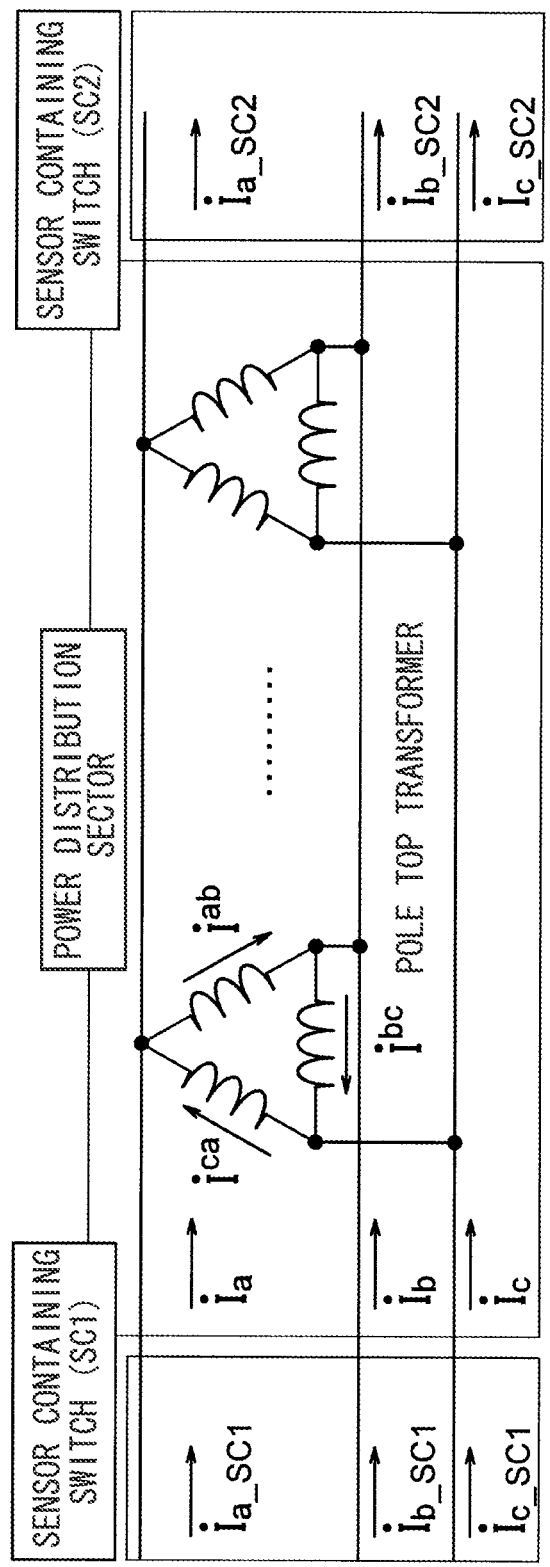
FIG. 3 is a schematic diagram illustrating a power distribution system as a hypothetical circuit configuration.

More specifically, for example, consider a power distribution system such as that illustrated in FIG. 3. The example in FIG. 3 is a three phase line circuit, in which the transformers are three phase transformers that form hypothetical triangular connection. Most pole top transformers in actual power distribution systems employ a single phase three line system, and normally employ only a single phase; however, in FIG. 3, in order to be able to handle plural possibilities of connection phase, the power distribution system is illustrated as a hypothetical circuit configuration. In the present exemplary embodiment, the sector sandwiched between two sensor containing switches is annotated "power distribution sector". The consumer is connected to the secondary side of the transformer.

The correspondence relationship between power distribution sectors and the transformers belonging to the power distribution sectors, and the correspondence relationship between transformers and the consumers connected to the transformers, are stored as power distribution data in a power distribution data storage section 22. The consumer selection section 12 references power distribution data stored in the power distribution data storage section 22 and selects a power distribution sector and a consumer corresponding to the received transformer ID.

The current value computation section 14 reads time series data of power consumption of the selected consumer, converts the power consumption time series data into time series data of current values, and computes time series data of the phase current caused by power consumption of the consumer. The power consumption time series data of the consumers may, for example, employ data determined by power meters with communication functions, such as smart meters, installed in the consumer. The power consumption of the consumer is measured over, for example, intervals of 30 minutes, and is stored in the power consumption data storage section 24 as time series data of power consumption for each of the consumers.

The frequency component computation section 30 computes the frequency components of the line current and the frequency components of the phase current by Fourier transforming the time series data of the line current in the selected distribution sector and the time series data of phase current caused by power consumption of the consumer. The time series data of the line current may be derived from the current values determined by the sensor containing switches that define the two ends of the power distribution sector.

The correlation coefficient computation section 16 computes the correlation coefficient between the line current of the selected distribution sector and the phase current caused by power consumption of the consumer using the line current frequency components and the phase current frequency components computed by the frequency component computation section 30. In the present exemplary embodiment, since a three phase line circuit is assumed as illustrated in FIG. 3, the correlation coefficient computation section 16 computes three types of correlation coefficient between the line current of each line on the high voltage side of the power distribution system (a-line, b-line, and c-line) and the phase current caused by power consumption of the consumer. The correlation coefficient computation section 16 also acquires frequency response characteristics of a filter that has been optimized and stored in a filter characteristic storage section 32 by the filter optimization section 34 as described below, and computes a phase coefficient applied to the filter.

The connection phase determination section 18 determines which phase the subject transformer is connected to on the high voltage side based on the 3 types of correlation coefficient computed by the correlation coefficient computation section 16. More detailed explanation follows regarding the determination method.

The output processing section 20 processes the determination result by the connection phase determination section 18 for displaying on a display, or printing on a printer, or the like, and outputs the determination result.

The filter optimization section 34 is described in detail later.

Explanation follows regarding principles that enable determination of the transformer connection phase based on the correlation coefficients between the line current of each line on the high voltage side of the power distribution system and the phase current caused by power consumption of the consumer.

Explanation follows regarding the principles that enable the transformer connection phase to be determined based on the correlation coefficients between the line current value of each of the lines on the high voltage side of the power distribution system, and the current value corresponding to the power consumption of the consumer.

When power is consumed by the consumer connected to the secondary side of the transformer, phase current also flows on the primary side of the transformer. It is possible to measure the current flowing in each of the lines on the high voltage side using the sensor containing switches, as described above.

As illustrated in FIG. 3, the net (complex) line current $\dot{I}(\cdot)_x$ flowing into one power distribution sector is defined as indicated in the first half of Equation (1) below. The relationship between each of the line currents $\dot{I}(\cdot)_x$ and the phase current $\dot{I}(\cdot)_i^y$ is expressed by the second half of Equation (1) below using Kirchhoff's law. $\dot{I}(\cdot)$, represented in the equations by adding a dot (·) above a letter (I), represents a complex number.

$$\begin{cases} \dot{I}_a = \dot{I}_{a\_SC1} - \dot{I}_{a\_SC2} \\ \dot{I}_b = \dot{I}_{b\_SC1} - \dot{I}_{b\_SC2} \\ \dot{I}_c = \dot{I}_{c\_SC1} - \dot{I}_{c\_SC2} \end{cases} \quad (1)$$

$$\begin{cases} \dot{I}_a = \dot{I}^{ab} - \dot{I}^{ca} = \sum_i \dot{I}^{ab}_i - \sum_k \dot{I}^{ca}_k \\ \dot{I}_b = \dot{I}^{bc} - \dot{I}^{ab} = \sum_j \dot{I}^{bc}_j - \sum_i \dot{I}^{ab}_i \\ \dot{I}_c = \dot{I}^{ca} - \dot{I}^{bc} = \sum_k \dot{I}^{ca}_k - \sum_j \dot{I}^{bc}_j \end{cases}$$

$$(1 \le i \le n_{ab}, 1 \le j \le n_{bc}, 1 \le k \le n_{ca})$$

Wherein $x \in \{a, b, c\}$ for $I(\cdot)_x$, and is the (complex) current flowing in line x on the high voltage side. $I(\cdot)_{x\_SC1}$ and $I(\cdot)_{x\_SC2}$ are current values measured at each of the respective sensor containing switches disposed at the two ends of line x. $y \in \{ab, bc, ca\}$ for $I(\cdot)^y$, and $I(\cdot)^y$ is the phase current of the y phase of the transformer. $y \in \{ab, bc, ca\}$ for $I(\cdot)^y_i$, and $I(\cdot)^y_i$ is the phase current of the y phase caused by the power consumption of the $i^{th}$ consumer. $n_y$ is the consumer connected to the y phase.

As can be seen from Equation (1), in the circuit illustrated in FIG. 3, there is a 1 to 2 relationship between the phase current of the transformer and the line current of the power distribution line, and the power consumption of the consumer influences two lines out of the 3 power distribution lines. Even in cases in which the consumer is connected to a transformer connected to one of the phases, one line out of two lines is redundant, and so the power data is not independent between the high voltage side and the low voltage side (consumer side), and so connection phase determination by correlation analysis is not appropriate.

In contrast thereto, for current, a phase current and a line current are independently present as a combination. For example, it can be seen from Equation (1) that the phase current $I(\cdot)^{ab}_i$ of the ab phase caused by power consumption of a consumer connected to the ab phase is unrelated to the line current $I(\cdot)_c$. There are also similar independent combinations present for the relationships between the other phase currents and line currents. It is accordingly possible to determine the transformer connection phase as long as the differences in such correlation can be estimated by statistical analysis. Explanation next follows regarding determination of transformer connection phase by correlation analysis using current data.

As stated above, the high voltage side of the power distribution system is configured by a three phase three line system with a phase difference of $2\pi/3$ between each of the phase currents. If the latter part of Equation (1) is expressed by phase current broken down into amplitude and phase, this results in the following Equation (2).

$$\begin{cases} \dot{I}_a = \sum_i \dot{I}^{ab}_i - e^{j\frac{2}{3}\pi} \sum_k \dot{I}^{ca}_k \\ \dot{I}_b = e^{-j\frac{2}{3}\pi} \sum_j \dot{I}^{bc}_j - \sum_i \dot{I}^{ab}_i \\ \dot{I}_c = e^{j\frac{2}{3}\pi} \sum_k \dot{I}^{ca}_k - e^{-j\frac{2}{3}\pi} \sum_j \dot{I}^{bc}_j \end{cases} \quad (2)$$

$$I_x = |\dot{I}_x|, x \in \{a, b, c\}$$

$$I^y_i = |\dot{I}^y_i|, y \in \{ab, bc, ca\}$$

The amplitude of the phase current may be obtained by adding the real component values for the same phase, and so may be compiled by following Equation (3).

$$I^y = \left|\sum_i \dot{I}^y_i\right| = \sum_i |\dot{I}^y_i| = \sum_i I^y_i \quad (3)$$

The following Equation (4) uses Equation (2) and Equation (3) and expresses the amplitude of the line current of the a-line as phase current.

$$I_a = |\dot{I}_a| = \left|\sum_i \dot{I}^{ab}_i - e^{j\frac{2}{3}\pi} \sum_k \dot{I}^{ca}_k\right| \quad (4)$$

Assuming the power distribution system has symmetrical three phase alternating current, then the amplitude of the line current of the a-line is expressed by following Equation (5). Note that the symmetrical three phase alternating current has equal electromotive force and frequency for the three phases, and the phase differences are all $2\pi/3$.

$$I_a = \sqrt{(I^{ab})^2 + (I^{ca})^2 - 2I^{ab}I^{ca}\cos\frac{2\pi}{3}} \quad (5)$$

$$= \sqrt{(I^{ab})^2 + (I^{ca})^2 + I^{ab}I^{ca}}$$

Taking the first order Taylor expansion approximation of Equation (5), the relationship between the line current of the a-line, and the rate of instantaneous change in the phase current of phase ab and the phase current of phase ca can be expressed by the following Equation (6).

$$dI_a \sim \frac{2I^{ab} + I^{ca}}{2\sqrt{(I^{ab})^2 + (I^{ca})^2 + I^{ab}I^{ca}}}dI^{ab} + \frac{2I^{ca} + I^{ab}}{2\sqrt{(I^{ab})^2 + (I^{ca})^2 + I^{ab}I^{ca}}}dI^{ca} \quad (6)$$

Moreover, assuming the load impedance connected to each phase has the same equilibrium load, then from $I^{ab} = I^{ca}$, a linear approximation is obtained as the following Equation (7) for the rate of instantaneous change from a state of equilibrium.

$$dI_a \sim \frac{\sqrt{3}}{2}dI^{ab} + \frac{\sqrt{3}}{2}dI^{ca} \quad (7)$$

Since it is possible to derive the same approximations for the other line currents, the rate of instantaneous change of line current can be estimated by the 3 approximations of the following Equation (8).

$$\begin{cases} dI_a \sim \frac{\sqrt{3}}{2}(dI^{ab} + dI^{ca}) \\ dI_b \sim \frac{\sqrt{3}}{2}(dI^{bc} + dI^{ab}) \\ dI_c \sim \frac{\sqrt{3}}{2}(dI^{ca} + dI^{bc}) \end{cases} \quad (8)$$

In order to apply correlation analysis to current data, time series data of line current $I_x(t)$, and time series data of phase current $I_d^y(t)$ is defined by the following Equation (9-1). In Equation (9-1), values expressing displacement from the time averages of measurement values $I'_x(t)$ of the line current, and measurement values $I'_d^y(t)$ of the phase current are respectively employed as $I_x(t)$, and $I_d^y(t)$.

$$I_x(t) = I'_x(t) - \mu(I'_x(t)), x \in \{a,b,c\}$$

$$I_d^y(t) = I'_d^y(t) - \mu(I'_d^y(t)), y \in \{ab, bc, ca\} \quad (9\text{-}1)$$

($\mu(\cdot)$ is the time average)

For a given phase, the amplitude of the line current may be treated as a real number when deriving the net line current $I'_x(t)$ flowing in each power distribution sector as illustrated in FIG. 3 from measurement values of the sensor containing switches. Then, as in the following Equation (9-2), the line current $I'_x(t)$ is obtained by subtracting the measurement value in the downstream sensor containing switch (SC2) from the measurement value in the upstream sensor containing switch (SC1).

$$I'_x(t) = I'_{x\_SC1}(t) - I'_{x\_SC2}(t), x \in \{a,b,c\} \quad (9\text{-}2)$$

In Equation (9-1), the phase current $I'_d^y(t)$ caused by power consumption of the consumer d connected to phase y of the transformer may be computed from the amount of power consumption measured by the power meter using the following Equation (10). In such cases, the contracted voltage is employed as a constant for the voltage value. The current value computed from the consumed power in the consumer measured by the power meter and from the contracted voltage (real number value) is a real number, and so is expressed in terms of $\sqrt{2}$ to derive the amplitude (maximum value) in Equation (10). The current value computed in Equation (10) only has the meaning of the average current amount over the sampling interval of the power meter, and so there is no problem in implementing statistical analysis as long as the line current is also subjected to equivalent processing.

$$I'_d^y(t) = \frac{\sqrt{2}}{k} \cdot \frac{P_d(t)}{V_d} \quad (10)$$

For $P_d(t)$ in the time series data of power consumption of the consumer d, $V_d$ is the contracted voltage (real component value) of consumer d, and k is the transformer ratio.

The covariance $\sigma^y_{x,d}$ and the correlation coefficient $\rho^y_{x,d}$ between the time series data of each line current $I_x(t)$ and the time series data of each phase current $i^y_d(t)$ may be defined by the following Equation (11).

The explanatory text below employs phase current caused by power consumption of the consumer d as defined by Equation (10). However, $P_d(t)$ may be employed as is in place of $I'^y_d(t)$ of Equation (10) since computation of the correlation coefficients and the like give the same result even when constant factors are ignored.

$$\sigma^y_{x,d} = \frac{1}{T}\sum_{t=1}^{T} I_x(t) I_d^y(t) \quad (11)$$

$$\rho^y_{x,d} = \frac{\sigma^y_{x,d}}{\sigma_x \sigma^y_d} = \frac{\frac{1}{T}\sum_{i=1}^{T} I_x(t) I_d^y(t)}{\sqrt{\frac{1}{T}\sum_{t=1}^{T} I_x(t)^2} \sqrt{\frac{1}{T}\sum_{t=1}^{T} I_d^y(t)^2}}$$

$$(-1 \le \rho^y_{x,d} \le 1)$$

Wherein $\sigma_x$ is the deviation in $I_x(t)$, $\sigma^y_d$ is the deviation in $I'^y_d(t)$, and T is the number of sampling points in the time series data.

There are 3×3=9 correlation coefficients and covariances defined in Equation (11) by combining the subscripts x and y. The specific actual values held by these correlation coefficients are determined by changes with time in the power consumption of each of the consumers, and how the transformer connection phases that define the relationship between the line current and the phase current are set.

Explanation follows regarding values of correlation coefficients when appropriate assumptions are made for the time series data of power consumption. Application of Equation (8) enables the time series data of values of each of the line currents to be approximated by the following Equation (12).

$$\begin{cases} I_a(t) \sim \frac{\sqrt{3}}{2}\left(\sum_i I_i^{ab}(t) + \sum_k I_k^{ca}(t)\right) \\ I_b(t) \sim \frac{\sqrt{3}}{2}\left(\sum_j I_j^{bc}(t) + \sum_k I_i^{ab}(t)\right) \\ I_c(t) \sim \frac{\sqrt{3}}{2}\left(\sum_k I_k^{ca}(t) + \sum_j I_k^{bc}(t)\right) \end{cases} \quad (12)$$

$$I_i^y(t) = I_i'^y(t) - \mu(I_i'^y(t)), y \in \{ab, bc, ca\}$$

($\mu(\cdot)$ is the time average)

Assume the phase current $I_i^y(t)$ caused by power consumption in each of all the consumers including consumer d follow mutually independent normal distributions N (0, $\sigma_0^2$).

First, the deviation $\sigma_x$ in the time series data of each of the line currents $I_x(t)$, and the covariance $\sigma^{ab}_{x,d}$ between the line current $I_x(t)$ and the phase current $i^{ab}_d(t)$ in cases in which the consumer d is connected to the phase ab, are given by the following Equation (13), derived from Equation (11) and Equation (12).

$$\begin{cases} \sigma_a \sim \frac{\sqrt{3}}{2} \cdot \sqrt{n_{ab} + n_{ca}} \cdot \sigma_0 \\ \sigma_b \sim \frac{\sqrt{3}}{2} \cdot \sqrt{n_{bc} + n_{ab}} \cdot \sigma_0 \\ \sigma_c \sim \frac{\sqrt{3}}{2} \cdot \sqrt{n_{ca} + n_{bc}} \cdot \sigma_0 \end{cases} \quad (13)$$

$$\begin{cases} \sigma_{a,d}^{ab} = \frac{1}{T}\sum_{t=1}^{T} I_a(t)I_d^{ab}(t) \sim \\ \frac{1}{T}\sum_{t=1}^{T}\left[\frac{\sqrt{3}}{2}\left(\sum_l I_l^{ab}(t)+\sum_k I_k^{ca}(t)\right)I_d^{ab}(t)\right] = \frac{\sqrt{3}}{2}\sigma_0^2 \\ \sigma_{b,d}^{ab} = \frac{1}{T}\sum_{t=1}^{T} I_c(t)I_d^{ab}(t) \sim \\ \frac{1}{T}\sum_{t=1}^{T}\left[\frac{\sqrt{3}}{2}\left(\sum_j I_j^{bc}(t)+\sum_i I_i^{ab}(t)\right)I_d^{ab}(t)\right] = \frac{\sqrt{3}}{2}\sigma_0^2 \\ \sigma_{c,d}^{ab} = \frac{1}{T}\sum_{t=1}^{T} I_c(t)I_d^{ab}(t) \sim \\ \frac{1}{T}\sum_{t=1}^{T}\left[\frac{\sqrt{3}}{2}\left(\sum_l I_k^{ca}(t)+\sum_j I_j^{bc}(t)\right)I_d^{ab}(t)\right] = 0 \end{cases}$$

The result of the latter part in Equations (13) is obtained from the condition that the phase current $I_d^{ab}(t)$ of the phase ab caused by power consumption of the consumer d correlates only to the portion of the line current caused by the phase current itself. If the result is substituted into the definition of the correlation coefficient, then in a case in which the consumer d is connected to phase ab, the correlation coefficient between each of the line currents and the phase current of the phase ab can be derived as illustrated in the following Equation (14).

$$\begin{cases} \rho_{a,d}^{ab} = \frac{\sigma_{a,d}^{ab}}{\sigma_a \sigma_d^{ab}} \sim \frac{\frac{\sqrt{3}}{2}\sigma_0^2}{\left(\frac{\sqrt{3}}{2}\cdot\sqrt{n_{ab}+n_{ca}}\cdot\sigma_0\right)\cdot\sigma_0} = 1/\sqrt{n_{ab}+n_{ca}} \\ \rho_{b,d}^{ab} = \frac{\sigma_{a,d}^{ab}}{\sigma_b \sigma_d^{ab}} \sim \frac{\frac{\sqrt{3}}{2}\sigma_0^2}{\left(\frac{\sqrt{3}}{2}\cdot\sqrt{n_{bc}+n_{ab}}\cdot\sigma_0\right)\cdot\sigma_0} = 1/\sqrt{n_{bc}+n_{ab}} \\ \rho_{c,d}^{ab} = \frac{\sigma_{c,d}^{ab}}{\sigma_c \sigma_d^{ab}} \sim 0 \end{cases} \quad (14)$$

Similar computations are also possible for cases in which the consumer d is connected to the other phases. The following Equations (15) are approximate equations for the correlation coefficients between each of the line currents and phase currents by connection phase of the consumer d.

$$\rho_{a,d}^y \sim \begin{cases} 1/\sqrt{n_{ab}+n_{ca}} & (y=ab, ca) \\ 0 & (y=bc) \end{cases} \quad (15)$$

$$\rho_{b,d}^y \sim \begin{cases} 1/\sqrt{n_{bc}+n_{ab}} & (y=ab, bc) \\ 0 & (y=ca) \end{cases}$$

$$\rho_{c,d}^y \sim \begin{cases} 1/\sqrt{n_{ca}+n_{bc}} & (y=bc, ca) \\ 0 & (y=ab) \end{cases}$$

As illustrated in Equation (15), there is a one-to-one correspondence between the transformer connection phase to which the consumer d is connected, and type of correlation coefficient that approximates to a value of 0. The correlation coefficients that do not have a value approximating to 0 hold values dependent on the distribution of each of the connection phases for all the consumers.

Up to now calculation has proceeded on the assumption that there is a single consumer d; however, when there is usable data for power consumption for plural consumers connected to the same transformer, it is possible to improve the precision of determination of the transformer connection phase.

Specifically, the total consumed power amount is acquired for each of the consumers for every measurement time, enabling an improvement to be achieved in the determination precision of the transformer connection phase by treating the acquired total as consumed power for a large hypothetical consumer. For example, take a case in which it is possible, for example, to use time series data for power consumption of consumers for $n_d$ households. Moreover, the distribution of phase current caused by the power consumption of this hypothetical consumer follows a normal distribution of N (0, $n_d\sigma_0^2$). In such cases, the approximations of correlation coefficient may be replaced as in following Equations (16) and the difference in the correlation coefficients changes in proportion to the $n_d$.

$$\rho_{a,d}^y \sim \begin{cases} \sqrt{\frac{n_d}{n_{ab}+n_{ca}}} & (y=ab, ca) \\ 0 & (y=bc) \end{cases} \quad (16)$$

$$\rho_{b,d}^y \sim \begin{cases} \sqrt{\frac{n_d}{n_{bc}+n_{ab}}} & (y=ab, bc) \\ 0 & (y=ca) \end{cases}$$

$$\rho_{c,d}^y \sim \begin{cases} \sqrt{\frac{n_d}{n_{ca}+n_{bc}}} & (y=bc, ca) \\ 0 & (y=ab) \end{cases}$$

The actual phase current is not limited to one with a normal distribution such as is assumed above. However similarly, even in general cases, from out of the 3 types of correlation coefficient, the one correlation coefficient present that has a smaller value compared to the others corresponds to the connection phase of the transformer. Focusing on this fact enables the correlation coefficients of the time series data of the line current for each of the lines on the high voltage side of the power distribution system, against the time series data of the phase current caused by power consumption by the consumer, to be calculated, and enables the transformer connection phase to which the consumer is detected to be determined by comparison therebetween.

Although explanation has been given above regarding a case in which the correlation coefficients between the line current and the phase current are computed using respective time series data, explanation follows regarding a case in which the computation employs only frequency domain data (frequency components). Employing frequency components enables easy optimization of the filter applied to the current data (described in detail below), and easy correction of quantized errors explained in the second exemplary embodiment.

Initially, correlation functions generally employed in signal processing, and spectra thereof, are introduced as represented by Equation (17) below.

$$C_{xx}(\tau) = \overline{x(t)x(t+\tau)} = \lim_{T\to\infty}\frac{1}{T}\int_{-T/2}^{T/2} x(t)x(t+\tau)dt \quad (17)$$

-continued $$C_{xy}(\tau) = \overline{x(t)y(t+\tau)} = \lim_{T\to\infty} \frac{1}{T}\int_{-T/2}^{T/2} x(t)y(t+\tau)dt$$

$$R_{xy}(\tau) = \frac{C_{xy}(\tau)}{\sqrt{C_{xx}(0)}\sqrt{C_{yy}(0)}} = \frac{\overline{x(t)y(t+\tau)}}{\sqrt{\overline{x(t)^2}}\sqrt{\overline{y(t)^2}}}$$

Herein, $C_{xx}(\tau)$ is an autocorrelation function of the time series data $x(t)$, $C_{xy}(\tau)$ is a cross-correlation function between the time series data $x(t)$ and $y(t)$, and $R_{xy}(\tau)$ is a normalized cross-correlation function between the time series data $x(t)$ and $y(t)$. Moreover, $x(t)^-$ is the time average of the time series data $x(t)$, and T is the overall segment length of the time series data. Note that, $x(t)^-$ is a symbol indicating that there is a bar (¯) above the characters ($x(t)$) in an equation. In the present exemplary embodiment, Equation (18) is taken as the correlation coefficient.

$$\rho_{xy} = R_{xy}(0) \tag{18}$$

Fourier transform of an autocorrelation function gives a function known as a power spectrum, and Fourier transform of a cross-correlation function gives a function known as a cross-spectrum. Fourier transformations like those represented by Equation (19) below are performed.

$$C_{xx}(\tau) = \int_{-\infty}^{\infty} S_{xx}(\omega)e^{i\omega\tau}d\omega \tag{19}$$

$$C_{xy}(\tau) = \int_{-\infty}^{\infty} S_{xy}(\omega)e^{i\omega\tau}d\omega$$

$$S_{xx}(\omega) = \frac{1}{2\pi}\int_{-\infty}^{\infty} C_{xx}(\tau)e^{-i\omega\tau}d\tau$$

$$S_{xy}(\omega) = \frac{1}{2\pi}\int_{-\infty}^{\infty} C_{xy}(\tau)e^{-i\omega\tau}d\tau$$

Herein, $S_{xx}(\omega)$ is the power spectrum of the time series data $x(t)$, and $S_{xy}(\omega)$ is the cross-spectrum between the time series data $x(t)$ and $y(t)$.

The Fourier transform is defined for a signal of infinite length. In reality, however, a fast Fourier transform (FFT) is often computed for each spectrum of segments given by dividing time series data into appropriate segments, and their ensemble average is taken to statistically estimate a spectrum. The ensemble average is an average value derived for a collection of measurement values or the like. Herein, the ensemble average of spectra derived using FFT on each divided segment indicates estimated values of the spectra of all of the segments, obtained by deriving an average value for each frequency from the values of all of the segments. In Equation (20) below, $S_{xx}(\omega)$ and $S_{xy}(\omega)$, mentioned above, represent ensemble averages.

$$S_{xx}(\omega) = \left\langle \frac{2\pi}{T} X^*(\omega)X(\omega) \right\rangle \tag{20}$$

$$S_{xy}(\omega) = \left\langle \frac{2\pi}{T} X^*(\omega)Y(\omega) \right\rangle$$

where $$X(\omega) = \frac{1}{2\pi}\int_{-\infty}^{\infty} x(t)e^{-i\omega t}dt$$

$$x(t) = \int_{-\infty}^{\infty} X(\omega)e^{i\omega t}d\omega$$

$$Y(\omega) = \frac{1}{2\pi}\int_{-\infty}^{\infty} y(t)e^{-i\omega t}dt$$

$$y(t) = \int_{-\infty}^{\infty} Y(\omega)e^{i\omega t}d\omega$$

Wherein, * represents a complex conjugate, and < > represents an ensemble average.

Given Equation (17) and Equation (19), a relationship can be found between the correlation coefficients and the coefficients in each of the correlation functions as indicated by Equation (21).

$$\rho_{xy} = R_{xy}(0) = \frac{C_{xy}(0)}{\sqrt{C_{xx}(0)}\sqrt{C_{yy}(0)}} \tag{21}$$

However, given that the numerator of Equation (21) is represented by Equation (22) below, the relationship equation between the correlation coefficients and the cross-spectra represented by Equation (23) below can be obtained.

$$C_{xy}(0) = \int_{-\infty}^{\infty} S_{xy}(\omega)d\omega \tag{22}$$

$$\rho_{xy} = \frac{1}{\sqrt{\sqrt{C_{xx}(0)}\sqrt{C_{yy}(0)}}} \int_{-\infty}^{\infty} S_{xy}(\omega)d\omega \tag{23}$$

$$(S_{xy}(\omega) = K_{xy}(\omega) + iQ_{xy}(\omega))$$

Herein, $K_{xy}(\omega)$ is a co-spectrum between the time series data $x(t)$ and $y(t)$, and $Q_{xy}(\omega)$ is a quadrature spectrum between the time series data $x(t)$ and $y(t)$. Moreover, since the correlation coefficient is a real number, theoretically, the imaginary component of Equation (23) may be deleted, and the correlation coefficient may be calculated according to Equation (24) below from the real component (co-spectrum) of the cross-spectrum.

$$\rho_{xy} = \frac{1}{\sqrt{C_{xx}(0)}\sqrt{C_{yy}(0)}} \int_{-\infty}^{\infty} K_{xy}(\omega)d\omega \tag{24}$$

$$\left(\int_{-\infty}^{\infty} Q_{xy}(\omega)d\omega = 0\right)$$

Discrete approximation of the improper integral and the normalized term in Equation (24) yields Equation (25) below since co-spectra of real-valued functions are even functions ($K_{xy}(-\omega) = K_{xy}(\omega)$).

$$\int_{-\infty}^{\infty} K_{xy}(\omega)d\omega = \tag{25}$$

$$2\int_{0}^{\infty} \mathrm{Re}[S_{xy}(\omega)]d\omega \sim 2\Delta\omega \sum_{k=0}^{N-1} \mathrm{Re}\left[\left\langle \frac{2\pi}{T} X^*(\omega_k)Y(\omega_K) \right\rangle\right]$$

$$C_{xx}(0) = \int_{-\infty}^{\infty} S_{xx}(\omega)d\omega =$$

$$2\int_{0}^{\infty} S_{xx}(\omega)d\omega \sim 2\Delta\omega \sum_{k=0}^{N-1} \left\langle \frac{2\pi}{T} X^*(\omega_k)X(\omega_K) \right\rangle$$

$$C_{yy}(0) = \int_{-\infty}^{\infty} S_{yy}(\omega)d\omega =$$

$$2\int_{0}^{\infty} S_{yy}(\omega)d\omega \sim 2\Delta\omega \sum_{k=0}^{N-1} \left\langle \frac{2\pi}{T} Y^*(\omega_k)Y(\omega_K) \right\rangle$$

Herein, Re[ ] is a function that takes the real component of a complex number. Substituting Equation (25) into Equation (24) yields Equation (26) below that redefines the correlation coefficient using only the frequency components. Herein, $\omega_{N-1}$ is the (angular) Nyquist frequency.

$$\rho_{xy} = \frac{1}{\sqrt{C_{xx}(0)}\sqrt{C_{yy}(0)}} \int_{-\infty}^{\infty} K_{xy}(\omega)d\omega = \quad (26)$$

$$\frac{1}{\sqrt{C_{xx}(0)}\sqrt{C_{yy}(0)}} \int_{-\infty}^{\infty} \text{Re}[S_{xy}(\omega)]d\omega \sim$$

$$\frac{2\Delta\omega \sum_{k=0}^{N-1} \text{Re}\left[\left\langle \frac{2\pi}{T} X^*(\omega_k)Y(\omega_K) \right\rangle\right]}{\sqrt{2\Delta\omega \sum_{k=0}^{N-1} \left\langle \frac{2\pi}{T} X^*(\omega_k)X(\omega_K) \right\rangle} \sqrt{2\Delta\omega \sum_{k=0}^{N-1} \left\langle \frac{2\pi}{T} Y^*(\omega_k)Y(\omega_K) \right\rangle}} =$$

$$\frac{\sum_{k=0}^{N-1} \text{Re}[\langle X^*(\omega_k)Y(\omega_K) \rangle]}{\sqrt{\sum_{k=0}^{N-1} \langle |X(\omega_k)|^2 \rangle} \sqrt{\sum_{k=0}^{N-1} \langle |Y(\omega_k)|^2 \rangle}}$$

Note that it is not necessary to compute the correlation coefficient from the frequency components when taking the ensemble average according to Equation (26); a method in which Fourier transformation is simply performed once on the overall segment is also possible. Other than the example of Equation (26), the method of taking the ensemble average may be by a method according to Equation (27) to Equation (29) below. The manner by which the ensemble average is taken may be appropriately selected according to the characteristics of the time series data that is the subject of the computation. In the case of the present exemplary embodiment, selection may be made based on the degree of precision of the connection phase determination.

$$\rho_{xy} = \frac{\sum_{k=0}^{N-1} \text{Re}[X^*(\omega_k)Y(\omega_k)]}{\sqrt{\sum_{k=0}^{N-1} \langle |X(\omega_k)|^2 \rangle} \sqrt{\sum_{k=0}^{N-1} \langle |Y(\omega_k)|^2 \rangle}} \quad (27)$$

$$\rho_{xy} = \frac{\sum_{k=0}^{N-1} \text{Re}[\langle X^*(\omega_k)Y(\omega_k) \rangle]}{\sqrt{\sum_{k=0}^{N-1} |X(\omega_k)|^2} \sqrt{\sum_{k=0}^{N-1} |Y(\omega_k)|^2}} \quad (28)$$

$$\rho_{xy} = \frac{\sum_{k=0}^{N-1} \text{Re}[X^*(\omega_k)Y(\omega_k)]}{\sqrt{\sum_{k=0}^{N-1} |X(\omega_k)|^2} \sqrt{\sum_{k=0}^{N-1} |Y(\omega_k)|^2}} \quad (29)$$

Next, explanation follows regarding a case in which derivation of the correlation coefficient employing the frequency components as explained above, is applied for a correlation coefficient related to the current data employed in the transformer connection phase determination.

First, each type of line current data and the Fourier transforms thereof employed in the transformer connection phase determination are defined as indicated by Equation (30).

$$I_x(t) = \int_{-\infty}^{\infty} \hat{I}_x(\omega)e^{i\omega t} d\omega \quad (x \in \{a, b, c\}) \quad (30)$$

$$\hat{I}_x(\omega) = \frac{1}{2\pi} \int_{-\infty}^{\infty} I_x(t)e^{-i\omega t} dt$$

$$I_d(t) = \int_{-\infty}^{\infty} \hat{I}_d(\omega)e^{i\omega t} d\omega$$

$$\hat{I}_d(\omega) = \frac{1}{2\pi} \int_{-\infty}^{\infty} I_d(t)e^{-i\omega t} dt$$

Herein, $I_x(t)$ is the time series data of the line current of the x-line ($x \in \{a, b, c\}$), $I\hat{}_x(\omega)$ is the spectrum of the line current of the x-line, $I_d(t)$ is the time series data of the phase current caused by power consumption of the consumer d, and $I\hat{}_d(\omega)$ is the spectrum of the phase current caused by power consumption of the consumer d. Note that $I\hat{}$ is a symbol indicating that there is a hat ($\hat{}$) above the character (I) in an equation. Moreover, the time series data of the line current and the phase current in Equation (30) are processed to make the average value thereof 0 by subtracting the average value of the overall segment as in Equation (9-1).

The time series data $I_d(t)$ of the current values included in Equation (30) has a proportional relationship with $P_d(t)$ that is the time series data of the power consumption of the consumer d, according to the relationship of Equation (10). Accordingly, in place of $I_d(t)$ or the Fourier transform thereof, $I\hat{}_d(\omega)$, $P_d(t)$ or the Fourier transform thereof, $P\hat{}_d(\omega)$, may be employed in the computation of the correlation coefficient $\rho_{xd}$, introduced from Equation (31) onward. Explanation follows regarding a case in which $I_d(t)$ or $I\hat{}_d(\omega)$ is employed.

Next, the time series data of each type of current value and the spectrum forms thereof are introduced as indicated by Equation (31) below, by applying the general relationship between the spectrum of the time series data and the correlation coefficient explained above to the current data.

$$\rho_{xd} = R_{xd}(0) = \frac{C_{xd}(0)}{\sqrt{C_{xx}(0)}\sqrt{C_{dd}(0)}} \quad (31)$$

$$C_{xd}(0) = \int_{-\infty}^{\infty} S_{xd}(\omega) d\omega$$

$$C_{xx}(0) = \int_{-\infty}^{\infty} S_{xx}(\omega) d\omega$$

$$C_{dd}(0) = \int_{-\infty}^{\infty} S_{dd}(\omega) d\omega$$

$$S_{xd}(\omega) = \left\langle \frac{2\pi}{T} \hat{I}_x^*(\omega) \hat{I}_d(\omega) \right\rangle$$

$$S_{xx}(\omega) = \left\langle \frac{2\pi}{T} \hat{I}_x^*(\omega) \hat{I}_x(\omega) \right\rangle$$

$$S_{dd}(\omega) = \left\langle \frac{2\pi}{T} \hat{I}_d^*(\omega) \hat{I}_d(\omega) \right\rangle$$

When doing so, the correlation coefficients between $I_x(t)$ ($x \in \{a, b, c\}$) and $I_d(t)$ can be computed by Equation (32) below using similar logic to that of Equation (24).

$$\rho_{xd} = \frac{1}{\sqrt{C_{xx}(0)}\sqrt{C_{dd}(0)}} \int_{-\infty}^{\infty} K_{xd}(\omega) d\omega \qquad (32)$$

$$(S_{xd}(\omega) = K_{xd}(\omega) + iQ_{xd}(\omega))$$

Discrete approximation of the improper integral and the normalized term in Equation (32) yields Equation (33).

$$\int_{-\infty}^{\infty} K_{xd}(\omega) d\omega = \qquad (33)$$

$$2 \int_0^{\infty} \text{Re}[S_{xd}(\omega)] d\omega \sim 2\Delta\omega \sum_{k=0}^{N-1} \text{Re}\left[\left\langle \frac{2\pi}{T} \hat{I}_x^*(\omega_k) \hat{I}_d(\omega_k) \right\rangle\right]$$

$$C_{xx}(0) = \int_{-\infty}^{\infty} S_{xx}(\omega) d\omega =$$

$$2 \int_0^{\infty} S_{xx}(\omega) d\omega \sim 2\Delta\omega \sum_{k=0}^{N-1} \left\langle \frac{2\pi}{T} \hat{I}_x^*(\omega_k) \hat{I}_x(\omega_k) \right\rangle \quad (x \in \{a, b, c\})$$

$$C_{dd}(0) = \int_{-\infty}^{\infty} S_{dd}(\omega) d\omega =$$

$$2 \int_0^{\infty} S_{dd}(\omega) d\omega \sim 2\Delta\omega \sum_{k=0}^{N-1} \left\langle \frac{2\pi}{T} \hat{I}_d^*(\omega_k) \hat{I}_d(\omega_k) \right\rangle$$

When Equation (33) is substituted into Equation (32), the correlation coefficients between $I_x(t)$ ($x \in \{a, b, c\}$) and $I_d(t)$ can be computed according to Equation (34) below.

$$\rho_{xd} = \frac{1}{\sqrt{C_{xx}(0)}\sqrt{C_{dd}(0)}} \int_{-\infty}^{\infty} K_{xd}(\omega) d\omega = \qquad (34)$$

$$\frac{1}{\sqrt{C_{xx}(0)}\sqrt{C_{dd}(0)}} \int_{-\infty}^{\infty} \text{Re}[S_{xd}(\omega)] d\omega \sim$$

$$\frac{\sum_{k=0}^{N-1} \text{Re}\left[\left\langle \hat{I}_x^*(\omega_k) \hat{I}_d(\omega_k) \right\rangle\right]}{\sqrt{\sum_{k=0}^{N-1} \left\langle |\hat{I}_x(\omega_k)|^2 \right\rangle} \sqrt{\sum_{k=0}^{N-1} \left\langle |\hat{I}_d(\omega_k)|^2 \right\rangle}} \quad (x \in \{a, b, c\})$$

When the co-spectrum is defined as a normalized function $NK_{xd}(\omega_k)$ (a normalized spectrum), the correlation coefficient $\rho_{xd}$ can be written as in Equation (35).

$$\rho_{xd} \sim \sum_{k=0}^{N-1} NK_{xd}(\omega_k) \qquad (35)$$

where $$NK_{xd}(\omega_k) \equiv \frac{\text{Re}\left[\left\langle \hat{I}_x^*(\omega_k) \hat{I}_d(\omega_k) \right\rangle\right]}{\sqrt{\sum_{k=0}^{N-1} \left\langle |\hat{I}_x(\omega_k)|^2 \right\rangle} \sqrt{\sum_{k=0}^{N-1} \left\langle |\hat{I}_d(\omega_k)|^2 \right\rangle}}$$

($x \in \{a, b, c\}$)

In order to estimate the cross spectrum of the numerator and the power spectrum of the divisor for the function $NK_{xd}(\omega_k)$ that is in the correlation coefficient $\rho_{xd}$ and that is defined by Equation (35), the numerator and the divisor both include operations to take ensemble averages. This is equivalent to Equation (26) described in the general theory above. Accordingly, similarly to in the case of Equation (26), the method for taking the ensemble averages in the function $NK_{xd}(\omega_k)$ may, for example, be Equation (36) to Equation (38) below. In the present exemplary embodiment, explanation is given based on the definition of Equation (35).

$$NK_{xd}(\omega_k) \equiv \frac{\text{Re}\left[\left\langle \hat{I}_x^*(\omega_k) \hat{I}_d(\omega_k) \right\rangle\right]}{\sqrt{\sum_{k=0}^{N-1} \left\langle |\hat{I}_x(\omega_k)|^2 \right\rangle} \sqrt{\sum_{k=0}^{N-1} \left\langle |\hat{I}_d(\omega_k)|^2 \right\rangle}} \qquad (36)$$

($x \in \{a, b, c\}$)

$$NK_{xd}(\omega_k) \equiv \frac{\text{Re}\left[\left\langle \hat{I}_x^*(\omega_k) \hat{I}_d(\omega_k) \right\rangle\right]}{\sqrt{\sum_{k=0}^{N-1} |\hat{I}_x(\omega_k)|^2} \sqrt{\sum_{k=0}^{N-1} |\hat{I}_d(\omega_k)|^2}} \qquad (37)$$

($x \in \{a, b, c\}$)

$$NK_{xd}(\omega_k) \equiv \frac{\text{Re}\left[\hat{I}_x^*(\omega_k) \hat{I}_d(\omega_k)\right]}{\sqrt{\sum_{k=0}^{N-1} |\hat{I}_x(\omega_k)|^2} \sqrt{\sum_{k=0}^{N-1} |\hat{I}_d(\omega_k)|^2}} \qquad (38)$$

($x \in \{a, b, c\}$)

The transformer connection phase may be determined using the correlation coefficient that uses only the frequency components of the current data calculated by Equation (35), and then using logic similar to that of the transformer connection phase determination described above that used the correlation coefficients $\rho_{x,d}$ (Equation (16)) between the above time series data of the line current and the time series data of the phase current. Specifically, determination may be made as set out below. The $\min\{\cdot\}$ is a function that returns the minimum value. Note that $\rho_{xd}$ ($x \in \{a, b, c\}$) is a correlation coefficient representing the correlation between time series data $I_x(t)$ of the line current and the time series data $I_d(t)$ of the phase current using only the frequency components.

$\rho_{ad} = \min\{\rho_{ad}, \rho_{bd}, \rho_{cd}\} \rightarrow bc$ connection phase $\rho_{bd} = \min\{\rho_{ad}, \rho_{bd}, \rho_{cd}\} \rightarrow ca$ connection phase $\rho_{cd} = \min\{\rho_{ad}, \rho_{bd}, \rho_{cd}\} \rightarrow ab$ connection phase Next, explanation follows regarding the determination precision of the transformer connection phase employing the correlation coefficients as described above. In the present exemplary embodiment, a filter is applied to the measured line current data in order to increase determination precision.

In particular, in the present exemplary embodiment, a digital filter having characteristics of a general function system is applied, and the filter is optimized so as to have a characteristic of enabling an increase in the connection phase determination precision. More specifically, filter optimization and connection phase determination are performed using a procedure like that below.

(1) A probability variable α is defined to serve as a reliability index for connection phase determination from the values of the correlation coefficients capable of the three types of computation corresponding to the line currents, and α is discretely approximated to a value representing only the frequency components.
(2) The reliability index of (1) is derived for plural consumers, and the average value and a variance-covariance matrix are obtained for each frequency band thereof.
(3) Under the constraint that the average value of the reliability index is fixed (at 1, for example), optimum filter characteristics for optimizing the variance of the reliability index are derived by quadratic programming.
(4) A correlation coefficient applied with a filter having optimized characteristics is then computed, and the connection phase determination is performed.

Note that in (3) the filter coefficient does not need to be derived in since the determination of the connection phase is performed using the correlation coefficients of only the frequency components.

Explanation follows regarding a case in which the difference between correlation coefficients is set to the reliability index α as an example. More specifically, as indicated by Equation (39) below, a difference is indexed that employs two out of the correlation coefficients capable of the three types of computation.

$$\alpha_i = \rho_{x2d(i)} - \rho_{x1d(i)} \sim \sum_{k=0}^{N-1} NK_{x2d(i)}(\omega_k) - \sum_{k=0}^{N-1} NK_{x1d(i)}(\omega_k) \quad (39)$$

Herein, $\alpha_i$ is the reliability index for the phase determination of the $i^{th}$ consumer, and $\rho_{xd}(i)$ is the correlation coefficient between the line current of the x-line and the phase current caused by power consumption of the $i^{th}$ consumer. The combination of correlation coefficients employed as the difference in the computation of the reliability index is conceivably obtained from Equation (41) to Equation (43) below. Note that mid$\{\cdot\}$ is a function that returns the median value.

$$\begin{bmatrix} \rho_{x1d(i)} \colon x1 \text{ corresponds to the correct connection phase} \\ \rho_{x2d(i)} = \text{mid}\{\rho_{ad(i)}, \rho_{bd(i)}, \rho_{cd(i)}\} \end{bmatrix} \quad (40)$$

$$\begin{bmatrix} \rho_{x1d(i)} \colon x1 \text{ corresponds to the correct connection phase} \\ \rho_{x2d(i)} = \min\{\rho_{xd(i)}; x \neq x1\}, x \in \{a, b, c\} \end{bmatrix} \quad (41)$$

$$\begin{bmatrix} \rho_{x1d(i)} \colon x1 \text{ corresponds to the correct connection phase} \\ \rho_{x2d(i)} = \frac{1}{2} \sum_{\substack{x \in \{a,b,c\} \\ x \neq x1}} \rho_{xd(i)} \end{bmatrix} \quad (42)$$

$$\begin{bmatrix} \rho_{x1d(i)} = \min\{\rho_{ad(i)}, \rho_{bd(i)}, \rho_{cd(i)}\} \\ \rho_{x2d(i)} = \text{mid}\{\rho_{ad(i)}, \rho_{bd(i)}, \rho_{cd(i)}\} \end{bmatrix} \quad (43)$$

In a realistic scenario, Equation (40) to Equation (42) are employed in cases in which current data of known correct connection phases is utilized in filter optimizations, and Equation (43) is employed in cases in which current data of known correct connection phases cannot be utilized.

When Equation (43) is employed, the minimum value returned by the min$\{\cdot\}$ function is not necessarily the correct minimum correlation coefficient. A simple high pass filter is accordingly applied to the current data and a signal in which the minimum value has increased probability of being correct is treated as a base signal, with this then used to optimize the filter. Alternatively, the result of a determination employing data obtained by applying a simple high pass filter to the current data may be assumed to be correct, and filter optimization may be performed with the reliability index defined by Equation (40) to Equation (42). Moreover, a reliability index of higher precision may be obtained by repeatedly executing this processing.

Each of the terms in Equation (39) is an amount of change in consumer i, and can be thought of as samples extracted from the population of consumers that are subject to connection phase determination. Moreover, the terms in Equation (39) are defined by Equation (44) below in terms of $A(\omega_k)$ corresponding to each of the discretized frequencies, and the sum of $A(\omega_k)$ across the whole band, α, is used as a new probability variable.

$$\alpha = \sum_{k=0}^{N-1} A(\omega_k) \quad (44)$$

where $$A(\omega_k) = NK_{x2d}(\omega_k) - NK_{x1d}(\omega_k)$$

In cases in which Equation (42) is employed, $NK_{x2d}(\omega_k)$ may be derived as indicated by Equation (45) below, according to the definition of Equation (35), to serve as the combination of correlation coefficients employed for the difference. A pattern that uses the standardized co-spectrum definitions of Equation (36) to Equation (38) is also possible.

$$NK_{x2d}(\omega_k) = \frac{1}{2} \sum_{\substack{x2 \in \{a,b,c\} \\ x2 \neq x1}} \left( \frac{\text{Re}[\langle \hat{I}_{x2}^*(\omega_k)\hat{I}_d(\omega_k)\rangle]}{\sqrt{\sum_{k=0}^{N-1}\langle|\hat{I}_{x2}(\omega_k)|^2\rangle}\sqrt{\sum_{k=0}^{N-1}\langle|\hat{I}_d(\omega_k)|^2\rangle}} \right) \quad (45)$$

In cases other than cases in which Equation (42) is employed, the definition of Equation (35) may be employed as the combination of correlation coefficients employed for the difference. A pattern that uses the standardized co-spectrum definitions of Equation (36) to Equation (38) is also possible.

The probability variables $A(\omega_k)$ corresponding to different frequencies are not mutually independent in Equation (44), and the existence of some sort of co-variance function is assumed. There is no particular need to assume a normal distribution. The average, variance, and co-variance of the reliability index that samples the values $A_i(\omega_k)$ corresponding to each consumer then hold a relationship like that represented by Equation (46) below.

$$E[\alpha] = \sum_{k=0}^{N-1} E[A(\omega_k)] \quad (46)$$

-continued $$\text{Var}[\alpha] = \sum_{k=0}^{N-1} \text{Var}[A(\omega_k)] + 2 \sum_{\substack{0 \le k,l \le N-1 \\ k<l}} \text{Cov}[A(\omega_k), A(\omega_l)]$$

where $$E[A(\omega_k)] = \frac{1}{M} \sum_{i=1}^{M} A_i(\omega_k) \quad (M: \text{number of consumers})$$

$$\text{Var}[A(\omega_k)] = \frac{1}{M} \sum_{i=1}^{M} (A_i(\omega_k) - E[A(\omega_k)])^2$$

$$\text{Cov}[A(\omega_k), A(\omega_l)] = $$
$$\frac{1}{M} \sum_{i=1}^{M} (A_i(\omega_k) - E[A(\omega_k)])(A_i(\omega_l) - E[A(\omega_l)])$$

$$A_i(\omega_k) = NK_{x2d}^i(\omega_k) - NK_{x1d}^i(\omega_k)$$

Herein, E[ ] is a sample average, Var[ ] is a sample variance, Cov[ ] is a sample co-variance, $A_i(\omega_k)$ is a frequency component of the reliability index of the $i^{th}$ consumer, and $NK_{xd}^i(\omega_k)$ is the normalized spectrum of the $i^{th}$ consumer.

The reliability index α serving as the probability variable defined by Equation (44) has a probability distribution corresponding to the population of consumers. The reliability of the phase determination can be considered to be better the larger the average value of α and the smaller the distribution. However, an effect of a pseudo-correlation coefficient caused by, for example, daily periodicity in power demand sometimes adversely impacts the phase determination, and it is conceivable that the a that is effective for the phase determination differs for each band.

Thus a digital filter may be considered for multiplying appropriate coefficients by the frequency components in the summation in Equation (44), as indicated by Equation (47), and optimization of these coefficients may be considered. Herein, coefficient $b_k$ represents the frequency response characteristic of the filter.

$$\alpha' = \sum_{k=0}^{N-1} b_k A(\omega_k) \tag{47}$$

When this is done, the statistical quantities taken before and after application of the filter have a relationship like that of Equation (48) below.

$$E[\alpha'] = \sum_{k=0}^{N-1} b_k E[A(\omega_k)] \tag{48}$$

$$\text{Var}[\alpha'] = b^T G\, b$$

where $$b = (b_0, \ldots, b_{N-1})^T$$

$$G = \begin{pmatrix} \text{Cov}[A(\omega_0), A(\omega_0)] & \ldots & \text{Cov}[A(\omega_0), A(\omega_N)] \\ \vdots & \ddots & \vdots \\ \text{Cov}[A(\omega_N), A(\omega_0)] & \ldots & \text{Cov}[A(\omega_N), A(\omega_N)] \end{pmatrix}$$

To solve the problem of minimizing the variance value in the output of a digital filter having the above frequency response characteristic while holding the average value constant, a characteristic vector $\tilde{b} = (\tilde{b}_0, \ldots, \tilde{b}_{N-1})^T$ is derived corresponding to the frequency response characteristic $\tilde{b}_K$ of the optimum filter. Note that $\tilde{b}$ is a symbol indicating that there is a tilde (~) above the character (b) in an equation. Given Equation (48), this optimization problem can be formulated as a quadratic programming problem like that represented by Equation (49) below.

$$\text{min: } b^T G\, b \tag{49}$$

s.t.

$$\sum_{k=0}^{N-1} b_k E[A(\omega_k)] = 1,$$

$$0 \le b_k \quad (k = 0, \ldots, N-1)$$

where $$b = (b_0, \ldots, b_{N-1})^T$$

$$G = \begin{pmatrix} \text{Cov}[A(\omega_0), A(\omega_0)] & \ldots & \text{Cov}[A(\omega_0), A(\omega_N)] \\ \vdots & \ddots & \vdots \\ \text{Cov}[A(\omega_N), A(\omega_0)] & \ldots & \text{Cov}[A(\omega_N), A(\omega_N)] \end{pmatrix}$$

This problem is a problem of minimizing the variance value under the restriction that the average value of the filter output is held constant. From the viewpoint of probability distribution, this means changing the distribution of the probability variable α' (average: $\mu_{\alpha'}$, variance: $\sigma_{\alpha'}^2$) by changing the frequency response characteristic of the filter, and at the same time minimizing $\sigma_{\alpha'}^2/\mu_{\alpha'}$ or $\sigma_{\alpha'}/\mu_{\alpha'}$ under the restriction $\mu_{\alpha'}=1$. Note that $\sigma_{\alpha'}^2/\mu_{\alpha'}$ is a quantity that is the reciprocal of so-called the signal-to-noise ratio (SNR), and $\sigma_{\alpha'}/\mu_{\alpha'}$ is a statistical quantity known as the variation coefficient. These ratios are often used to quantify the quality of a probability distribution of, for example, measurement values. Accordingly, a minimum variance $\tilde{\sigma}_{\alpha'}^2$ or a minimum standard deviation $\tilde{\sigma}_{\alpha'}$ obtained as the minimum value of an objective function when $\mu_{\alpha'}$ is fixed at 1, or the reciprocals thereof, can be employed as the degree of reliability of the connection phase determination result.

In the present exemplary embodiment, as in Equation (26), the correlation coefficient can be formulated so as to be computed from only the frequency components, thereby enabling the problem of determining the frequency response characteristic of the optimum filter to be reduced to a quadratic programming problem that derives the frequency response characteristic of the filter such that the variance value of the reliability index is minimized under the constraint that the filter output is fixed, as in Equation (49). A representation matrix G having a quadratic form that forms the objective function in Equation (49) is a variance-covariance matrix, and is therefore a symmetrical positive-semidefinite matrix, and the objective function is a convex function. Moreover, the constraint equations are all linear in form, such that the problem is classed as a convex quadratic programming problem and as what is known as an easily solvable quadratic programming problem, and such that a global optimum solution is known to exist.

Note that the reliability index that forms the basis for formulating such a quadratic programming problem is not limited to the example of Equation (39), and variance minimization problems employing various equations can be conceived, as long as the reliability index is a quantity that can be represented as a linear sum of the frequency components. Moreover, although the average of the filter output is set to 1 in the above, this value may be freely selected, or may be adjusted after multiplication since the degrees of freedom of the frequency response characteristic $\tilde{b}_k$ of the derived optimum filter is a multiple of a constant number.

Next, explanation follows regarding application of the optimum filter. When the frequency response characteristic $\tilde{b}_k$ (k=0, ..., N−1) of the optimum filter obtained by solving the above problem is employed in the connection phase determination, the correlation coefficients $\tilde{\rho}_{xd}$ after applying the filter are computed, and magnitudes of the correlation coefficients $\tilde{\rho}_{xd}$ may be compared.

More specifically, the correlation coefficients $\tilde{\rho}_{dx}$ after application of the filter can be calculated according to Equation (50) using the normalized co-spectrum defined by Equation (35). A pattern that uses the standardized co-spectrum definitions of Equation (36) to Equation (38) is also possible.

$$\tilde{\rho}_{xd} = \sum_{k=0}^{N-1} \tilde{b}_k NK_{xd}(\omega_k) \quad (x \in \{a, b, c\}) \tag{50}$$

where $$NK_{xd}(\omega_k) = \frac{\text{Re}[\langle \hat{I}_x^*(\omega_k)\hat{I}_d(\omega_k)\rangle]}{\sqrt{\sum_{k=0}^{N-1}\langle|\hat{I}_x(\omega_k)|^2\rangle}\sqrt{\sum_{k=0}^{N-1}\langle|\hat{I}_d(\omega_k)|^2\rangle}}$$

As another calculation method, there is the method of applying the optimum filter to all of the current data employed in the calculation of the correlation coefficient, as indicated in Equation (51).

$$\tilde{\rho}_{xd} = \frac{\sum_{k=0}^{N-1}\tilde{b}_k^2 \text{Re}[\langle \hat{I}_x^*(\omega_k)\hat{I}_d(\omega_k)\rangle]}{\sqrt{\sum_{k=0}^{N-1}\tilde{b}_k^2\langle|\hat{I}_x(\omega_k)|^2\rangle}\sqrt{\sum_{k=0}^{N-1}\tilde{b}_k^2\langle|\hat{I}_d(\omega_k)|^2\rangle}} \tag{51}$$

$(x \in \{a, b, c\})$

The filter optimization section 34 of the present exemplary embodiment accordingly functions as the current value computation section 14, the frequency component computation section 30, and the correlation coefficient computation section 16, and the frequency response characteristic $\tilde{b}_k$ of the optimum filter is computed by solving the convex quadratic program represented by Equation (49). The filter optimization section 34 stores the computed frequency response characteristic $\tilde{b}_k$ of the computed optimum filter in the filter characteristic storage section 32.

Figure 4:
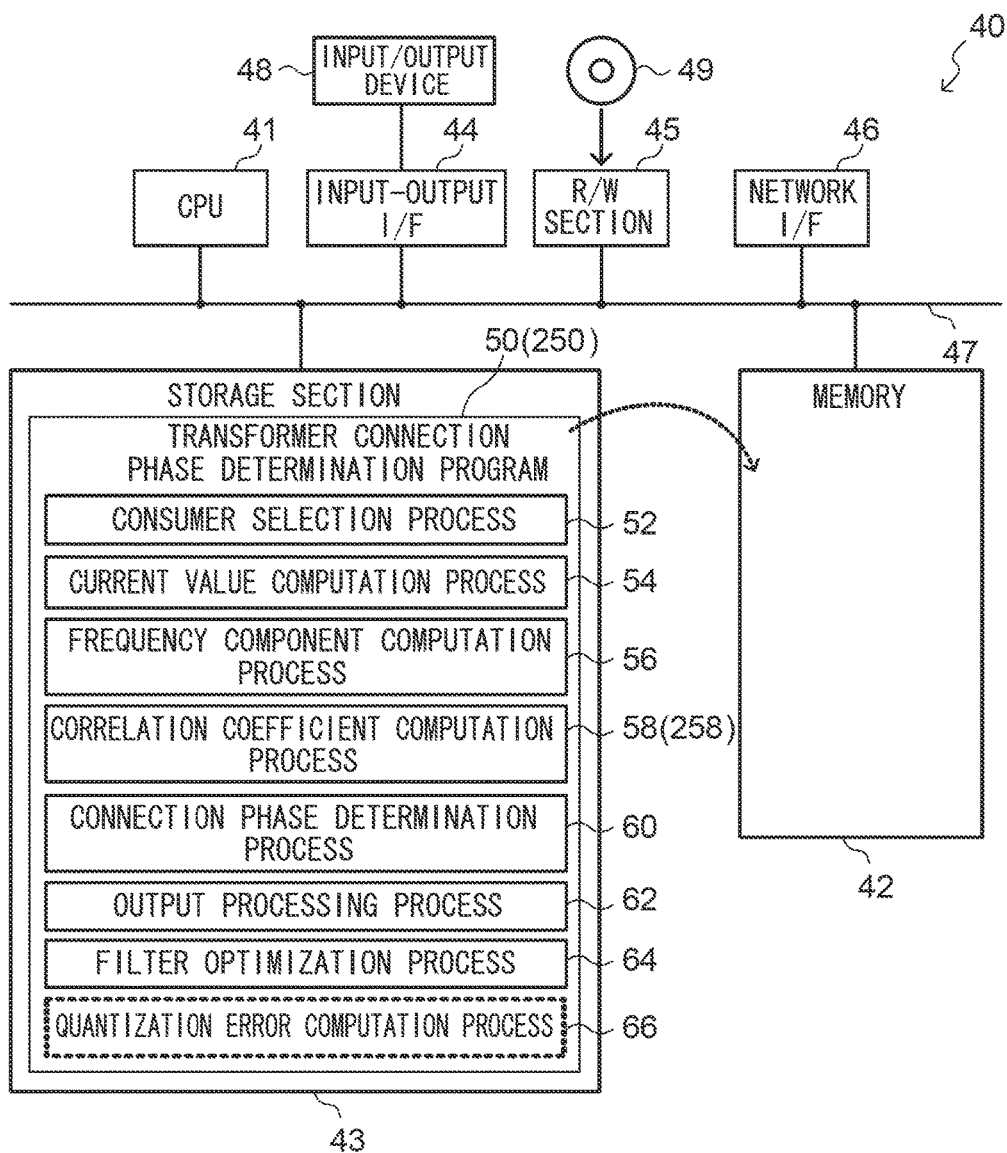
FIG. 4 is a block diagram illustrating a schematic configuration of a computer that functions as a transformer connection phase determination device according to a first exemplary embodiment and a second exemplary embodiment.

The transformer connection phase determination device 10 can be implemented by, for example, a computer 40 illustrated in FIG. 4. The computer 40 includes a CPU 41, memory 42 that serves as a temporary storage region, and a non-volatile storage section 43. The computer 40 further includes an input/output interface (I/F) 44 connected to an input/output device 48. The computer 40 further includes a read/write (R/W) section 45 that control reading and writing of data to and from a storage medium 49, and a network I/F 46 that is connected to a network such as the internet. The CPU 41, the memory 42, the storage section 43, the input/ output I/F 44, the R/W section 45, and the network I/F 46 are connected to one another through a bus 47.

The storage section 43 may be implemented by a Hard Disk Drive (HDD), solid state drive (SSD), flash memory, or the like. A transformer connection phase determination program 50 to cause the computer 40 to function as the transformer connection phase determination device 10 is stored on the storage section 43 as a storage medium. The CPU 41 reads the transformer connection phase determination program 50 from the storage section 43, expands the transformer connection phase determination program 50 in the memory 42, and sequentially executes the processes of the transformer connection phase determination program 50.

The transformer connection phase determination program 50 includes a consumer selection process 52, a current value computation process 54, a frequency component computation process 56, a correlation coefficient computation process 58, a connection phase determination process 60, an output processing process 62, and a filter optimization process 64.

The CPU 41 operates as the consumer selection section 12 illustrated in FIG. 2 by executing the consumer selection process 52. The CPU 41 operates as the current value computation section 14 illustrated in FIG. 2 by executing the current value computation process 54. The CPU 41 operates as the frequency component computation section 30 illustrated in FIG. 2 by executing the frequency component computation process 56. The CPU 41 operates as the correlation coefficient computation section 16 illustrated in FIG. 2 by executing the correlation coefficient computation process 58. The CPU 41 operates as the connection phase determination section 18 illustrated in FIG. 2 by executing the connection phase determination process 60. The CPU 41 operates as the output processing section 20 illustrated in FIG. 2 by executing the output processing process 62. The CPU 41 operates as the filter optimization section 34 illustrated in FIG. 2 by executing the filter optimization process 64. The computer 40 that executes the transformer connection phase determination program 50 accordingly functions as the transformer connection phase determination device 10.

Note that the transformer connection phase determination device 10 may be implemented with, for example, a semiconductor integrated circuit, and more specifically with an Application Specific Integrated Circuit (ASIC) or the like.

Operation of the Transformer Connection Phase Determination Device According the First Exemplary Embodiment Explanation follows regarding operation of the transformer connection phase determination device 10 according to the first exemplary embodiment. When a transformer ID, indicating a transformer subject to connection phase determination, has been input to the transformer connection phase determination device 10, the determination process illustrated in FIG. 5 is executed in the transformer connection phase determination device 10.

Figure 5:
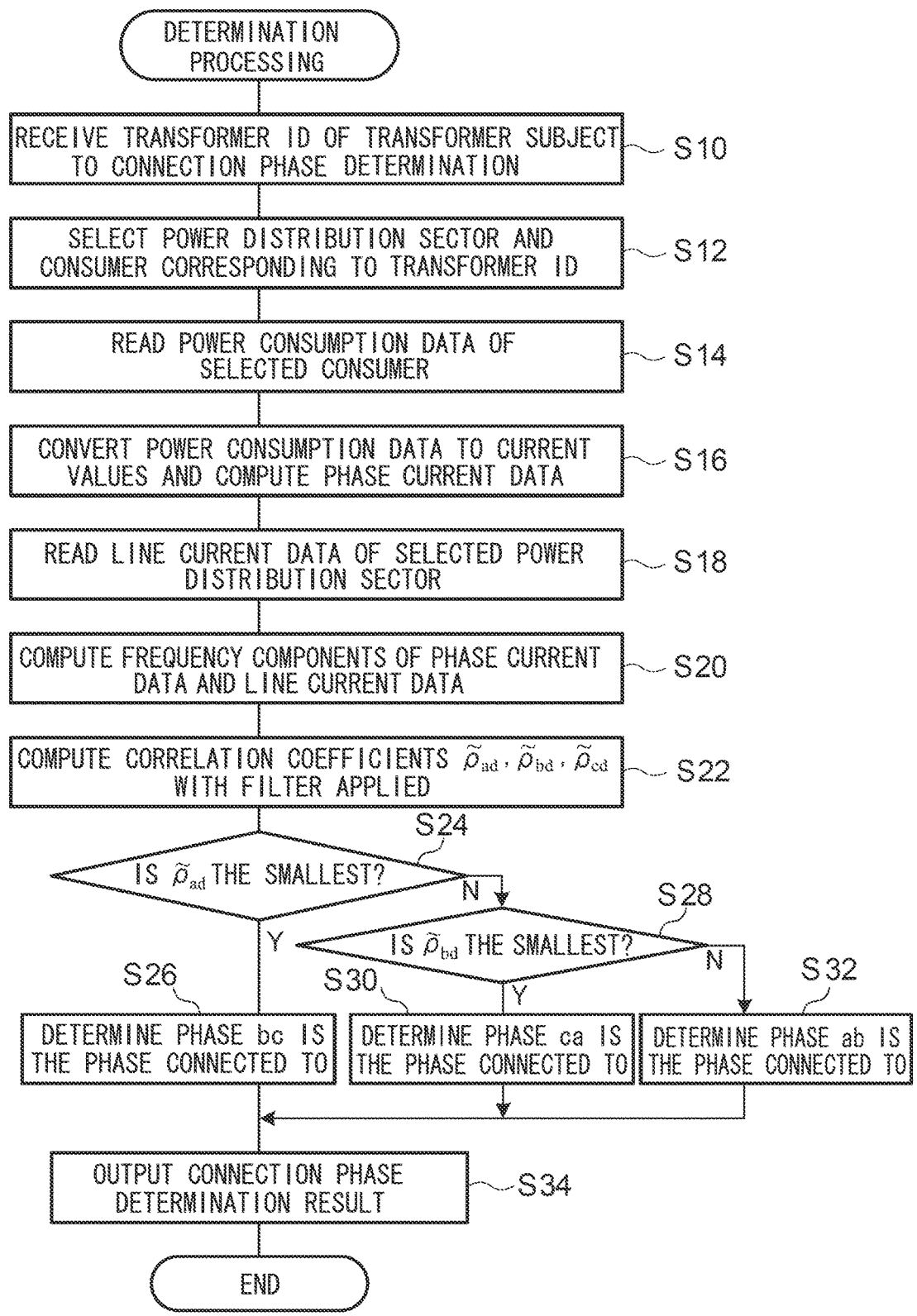
FIG. 5 is a flowchart illustrating an example of determination processing in the first exemplary embodiment.

At step S10 of the determination process illustrated in FIG. 5, the consumer selection section 12 receives the input transformer ID.

Then at step S12, the consumer selection section 12 selects the power distribution sector and consumers corresponding to the transformer ID received from the power distribution data storage section 22. A power distribution data table, for example such as that illustrated in FIG. 6, is stored in the power distribution data storage section 22. For each consumer, a consumer ID indicating the consumer, the transformer ID indicating the transformer to which the consumer is connected, and the power distribution sector ID indicting the power distribution sector to which the transformer belongs are stored corresponding in the power distribution table of FIG. 6. In this case, as illustrated in FIG. 3, the power distribution system is envisaged as a power distribution system in which there are plural power distribution sectors, sandwiched between the sensor containing switches disposed at the upstream side and the downstream side of the power distribution system, all connected together in series.

Then, for example, a power distribution sector ID indicating the power distribution sector sandwiched between the sensor containing switch (SC1) and the sensor containing switch (SC2) is defined as "I1-2". The power distribution data table of FIG. 6 includes a data availability flag indicating whether or not power consumption data for each of the consumer is usable. For example, if the power meter installed at the consumer, such as a smart meter, is connected through a network to the transformer connection phase determination device 10, then the power consumption data of that consumer is usable, and the data availability flag is set at "present". The distribution data table of FIG. 6 stores the "connection phase" for transformers for which the connection phase is known. The "connection phase" data is employed in filter optimization processing, described later.

The consumer selection section 12 thus selects the consumer ID and the power distribution sector ID corresponding to the transformer ID that matches the transformer ID received at step S10. Note that when the consumer ID is selected, consumer IDs with "present" as the data availability flag are selected. The consumer ID acquires plural consumer IDs if there are plural applicable consumer IDs present.

Then at step S14, the current value computation section 14 reads the power consumption data corresponding to the consumer ID selected at step S12, from the power consumption data storage section 24. A power consumption data table such as that illustrated in FIG. 7 is stored in the power consumption data storage section 24. The power consumption data table of FIG. 7 has amounts of power consumption (kWh) measured by a smart meter at fixed sampling time intervals (30 minutes in the example of FIG. 7) accumulated as time series data of power consumption for each consumer.

If the consumer ID selected at step S12 is for one household, then the power consumption data corresponding to that consumer ID may be read from the power consumption data table as is. For example, in the example of FIG. 6 and FIG. 7, if transformer ID=T1 is input, then since only consumer ID=d1 is selected, the power consumption data corresponding to consumer ID=d1 is read from the power consumption data table as is.

Moreover, if plural consumer IDs have been selected at step S12, then plural sets of power consumption data corresponding to the plural consumer IDs are read. The power consumption amounts for each of the sampling times are then added together for the plural sets of power consumption data, and power consumption data is generated for a hypothetical consumer.

For example, in the example in FIG. 6 and FIG. 7, if transformer ID=T2 has been input, then the consumer IDs=d2, d3 are selected. Note that d4 is not selected since it has a data availability flag of "absent". The power consumption data corresponding to consumer ID=d2, and the power consumption data corresponding to consumer ID=d3, are then read from the power consumption data table. Then power consumption data for a hypothetical consumer, of the power consumption amount for "0:00"=0.65+0.51=1.16, and the power consumption amount for "0:30"=0.62+0.44=1.06, and so on, is generated. This thereby results in power consumption data with an improved S/N ratio, compared to employing power consumption data corresponding to each individual consumer ID without further processing, and raises the precision of correlation coefficient computed in final stage processing.

Then at step S16, the current value computation section 14 converts the power consumption data read at step S14, or the generated hypothetical consumer power consumption data, into current values using Equation (10). These current values correspond to the time series data of the phase current caused by power consumption of the selected consumer.

Next, at step S18, the frequency component computation section 30 reads the three types of line current of the distribution sector indicated by the distribution sector ID selected at step S12 above, from a line current data storage section 26. A line current data table, like that illustrated in FIG. 8, for example, is stored in the line current data storage section 26. Net current values [A] measured for a fixed sampling interval (30 seconds in the example FIG. 8) are accumulated in the line current data table of FIG. 8 as the time series data of the line current for the respective a-line, b-line, and c-line of the distribution sector indicated by the distribution sector ID. The current value of the line current may employ a value computed according to Equation (9-2) using the line current value measured by the sensor containing switches disposed at either end of the distribution sector.

Next, at step S20, the frequency components are computed by Fourier transformation, such as FFT, of the time series data of the phase current caused by power consumption of the consumer computed at step S16 above and respective time series data of the line currents read at step S18 above. More specifically, the frequency component computation section 30 computes the line current spectrum $\tilde{\Gamma}_x(\omega)$ in Equation (30), and the phase current spectrum $\tilde{\Gamma}_d(\omega)$ caused by power consumption of the consumer d.

Next, at step S22, the correlation coefficient computation section 16 computes the correlation coefficient after application of the optimum filter using the respective frequency components of the phase current and the line current computed at step S20 above. More specifically, the correlation coefficient computation section 16 computes the correlation coefficient $\tilde{\rho}_{xd}$ from Equation (50) or Equation (51) using the line current spectrum $\tilde{\Gamma}_x(\omega)$ and the phase current spectrum $\tilde{\Gamma}_d(\omega)$, and the frequency response characteristic $\tilde{b}_k$ of the optimum filter stored in the filter characteristic storage section 32.

Then at step S24, the connection phase determination section 18 determines whether or not the correlation coefficient $\rho_{a,d}$ is the minimum out of the three types of correlation coefficient computed at step S22. If the correlation coefficient $\rho_{a,d}$ is the minimum, then processing transitions to step S26, and if the correlation coefficient $\rho_{a,d}$ is not the minimum, then processing transitions to step S28. At step S26, the connection phase determination section 18 determines whether or not the connection phase of the transformer indicated by the transformer ID received at step S10 is phase bc.

At step S28, determination is made as to whether or not the correlation coefficient $\rho_{b,d}$ is the minimum out of the three types of correlation coefficient computed at step S22. Processing transitions to step S30 if the correlation coefficient $\rho_{b,d}$ is the minimum, and processing transitions to step S32 if the correlation coefficient $\rho_{b,d}$ is not the minimum. At step S30, the connection phase determination section 18 determines if the connection phase of the transformer indicated by the transformer ID received at step S10 is the connection phase of the phase ca.

If processing has transitioned to step S30, namely if negative determination has been made at step S24 and step S28, then, since the correlation coefficient $\rho_{c,d}$ is the minimum, the connection phase determination section 18 determines that the connection phase of the transformer indicated by the transformer ID received at step S10 is the phase cd.

Then, at step S34, the output processing section 20 processes the determination result of step S26, S30 or S32, and outputs such as to display on a monitor, or to print by a printer. The determination result of step S26, S30 or S32 is made according to Equation (15).

Figure 9:
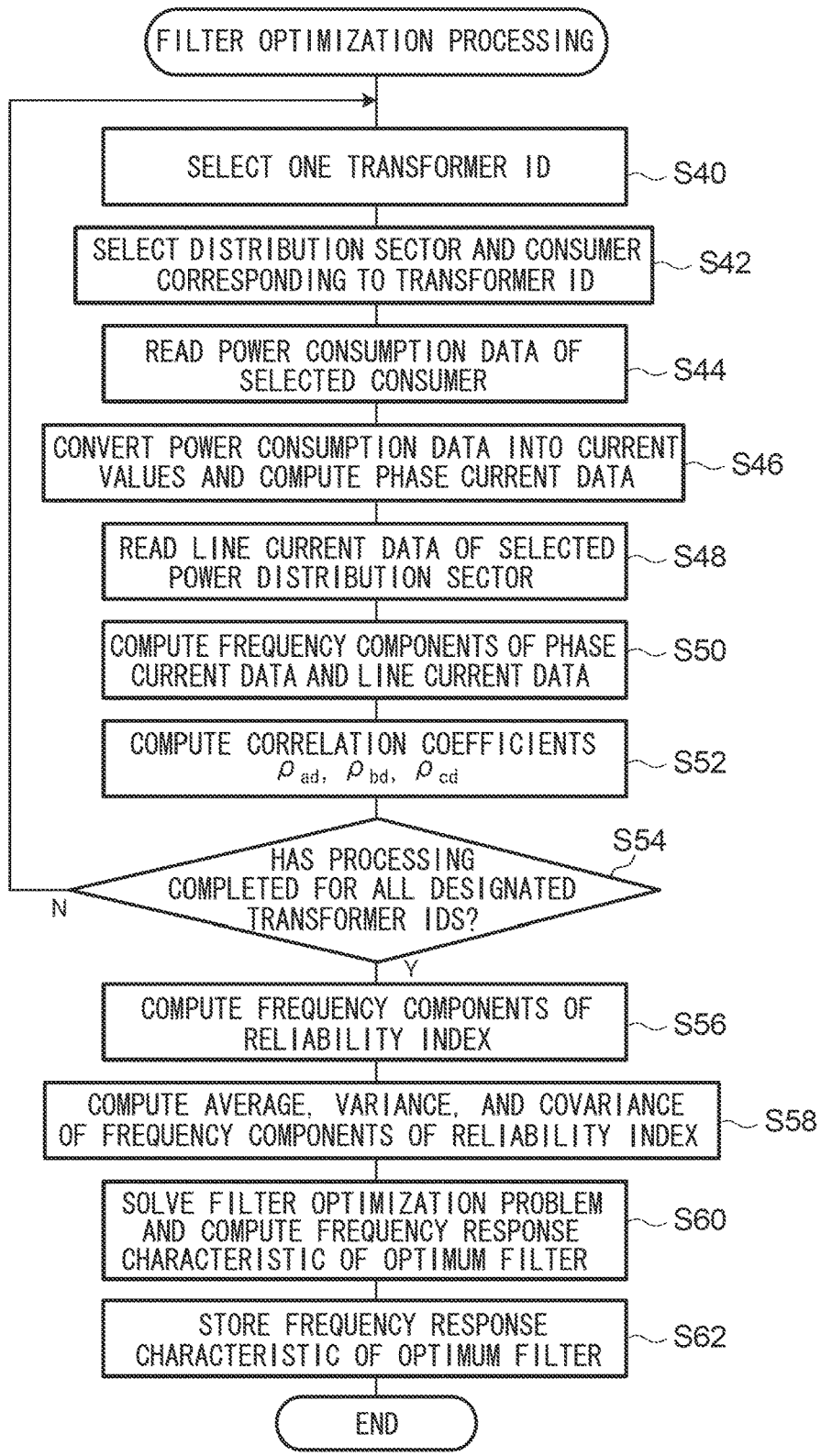
FIG. 9 is a flowchart illustrating an example of optimization processing in the first exemplary embodiment.

Next, explanation follows regarding the filter optimization processing performed in advance of the determination processing above, with reference to FIG. 9.

At step S40 of the filter optimization processing illustrated in FIG. 9, the filter optimization section 34 selects one transformer ID from plural transformer IDs designated for filter optimization. Next, at step S42 to step S52, the correlation coefficient $\rho_{xd}$ between the line current and the phase current is computed for the selected transformer ID by processing similar to the determination processing of steps S12 to S22 above. However, unlike during the determination processing, the correlation coefficient is computed by Equation (35) since the frequency response characteristic $\tilde{b}_k$ of the optimum filter has not yet been derived.

Next, at step S54, the filter optimization section 34 determines whether or not processing has completed for all of the transformer IDs designated for filter optimization. When there are unprocessed transformer IDs, processing returns to step S40, the next transformer ID is selected, and the processing of step S42 to S52 is repeated. When processing has completed for all of the transformer IDs, processing transitions to step S56.

At step S56, the filter optimization section 34 computes the frequency components of the reliability index corresponding to each transformer using the correlation coefficients $\rho_{xd}$ of all of the designated transformers (corresponding to a hypothetical collection of consumers). More specifically, the filter optimization section 34 derives $A_i(\omega_k)$ of Equation (46) for all of the transformers. When Equation (40) to Equation (42) are employed, the correlation coefficients calculated for the transformer IDs having known connection phases stored in the distribution data table may be employed as correlation coefficients of correct connection phases to serve as the collection of correlation coefficients employed for the difference in the calculation of the reliability index.

Next, at step S58, the filter optimization section 34 computes the average, variance, and covariance from the $A_i(\omega_k)$ corresponding to each transformer ID derived at step S56 above. More specifically, the filter optimization section 34 derives all of the $E[A(\omega_k)]$, $Var[A(\omega_k)]$, and $Cov[A(\omega_k), A(\omega_i)]$.

Next, at step S60, the filter optimization section 34 sets the quadratic programming problem of Equation (49) using the $E[A(\omega_k)]$, $Var[A(\omega_k)]$, and $Cov[A(\omega_k), A(\omega_i)]$ derived at step S58 above. The filter optimization section 34 then solves the set quadratic programming problem using existing technology for solving convex quadratic programs, and derives the frequency response characteristic $\tilde{b}_k$ (the characteristic vector $\tilde{b} = (\tilde{b}_0, \ldots, \tilde{b}_{N-1})^T$) for the optimum filter.

Next, at step S62, the filter optimization section 34 stores the derived frequency response characteristic $\tilde{b}_k$ of the optimum filter in the filter characteristic storage section 32, and the filter optimization processing ends. As described above, the frequency response characteristic $\tilde{b}_k$ of the optimum filter stored in the filter characteristic storage section 32 is employed at step S22 of the determination processing (see FIG. 5) as the characteristic of the filter applied during computation of the correlation coefficients.

As explained above, the transformer connection phase determination device 10 according to the first exemplary embodiment uses only the frequency components of the current data to compute the correlation coefficients between the respective line currents of the distribution lines on the high voltage side of the power supply system and the phase current caused by power consumption of the consumer connected to a transformer. Even if power consumption data can only be used for some of the consumers, these correlation coefficients computed for each type of line current include a single value that is small compared to the others, and that corresponds to the transformer connection phase. Accordingly, the transformer connection phase can be determined even when it is only possible to use power consumption data for a portion of the consumers connected to the transformer.

Moreover, the transformer connection phase determination device 10 according to the first exemplary embodiment applies the optimum filter when computing the correlation coefficients. This enables implementation of optimization of a digital filter that targets general function systems, since the computation of the correlation coefficients is performed using only the frequency components of current data.

Configuration of the Transformer Connection Phase Determination Device According to the Second Exemplary Embodiment Explanation next follows regarding the second exemplary embodiment. Portions similar to those of the transformer connection phase determination device 10 according to the first exemplary embodiment are allocated the same reference numerals and detailed explanation thereof is omitted.

Figure 10:
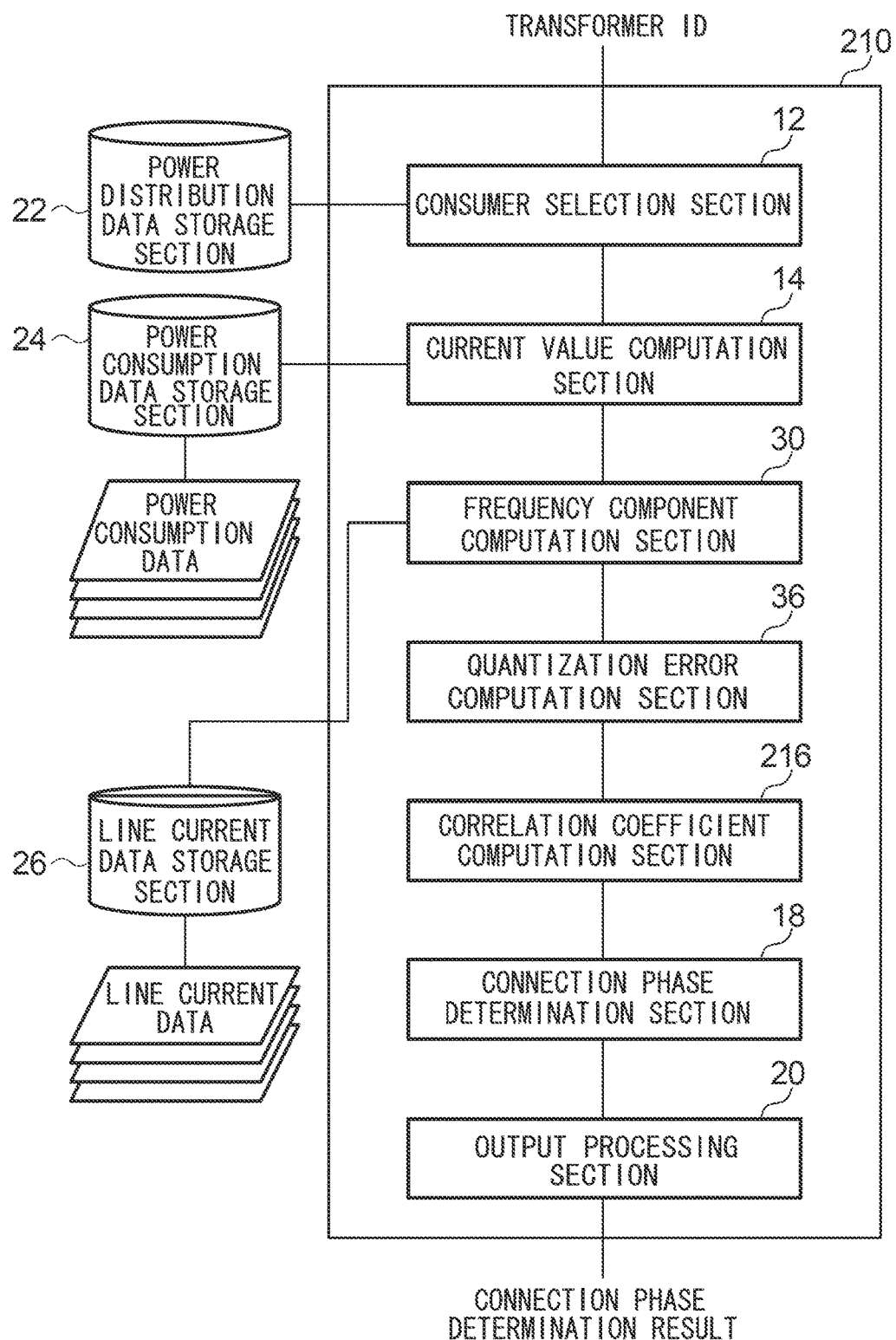
FIG. 10 is a block diagram representing a schematic configuration of a transformer connection phase determination device according to the second exemplary embodiment.

As illustrated in FIG. 10, a transformer connection phase determination device 210 according to the second exemplary embodiment includes a consumer selection section 12, a current value computation section 14, a frequency component computation section 30, a quantization error computation section 36, a correlation coefficient computation section 216, a connection phase determination section 18, and an output processing section 20.

The quantization error computation section 36 computes the frequency components of a quantization error for the purpose of excluding, from the correlation coefficients computed by the correlation coefficient computation section 216, effects of quantization errors arising during quantizing a measured value of line current (analog signal) into a digital signal.

The correlation coefficient computation section 216 computes the correlation coefficient $\rho_{xd}$ between the line current and the phase current using the frequency components of the each line current and the frequency components of the phase current computed by the frequency component computation section 30, and the frequency components of the quantization error computed by the quantization error computation section 36.

The respective data of the line currents at the high voltage side acquired using the sensor containing switches (SC) are measurements of high voltage currents, and therefore sometimes include large quantization errors that are introduced during final discretization in the measurement device. Thus, in the second exemplary embodiment, it is assumed that a spectrum function of the quantization error is known, and the effect of the quantization error on the phase determination is reduced by computing the correlation coefficients after carrying out correction using the spectrum function of the quantization error.

First, explanation follows regarding the quantization error in the transformer connection phase determination problem of the present exemplary embodiment.

Errors accompanying quantization of the analog signal are mostly treated as simple white noise due to being noise that randomly fluctuates within the quantization width. White noise is random noise having a limited variance and an average value of 0, and the distribution thereof is often assumed to be a normal (Gaussian) distribution. However, the present exemplary embodiment is not limited to the assumption of a normally distributed quantization error. In practice, quantization errors when rounding off is performed in digitization are uniformly distributed across the quantization width.

A distinguishing characteristic of white noise is that the power spectrum thereof is a constant function. Although noise of infinite length is theoretically required for the power spectrum to be strictly constant, the power spectrum may conceivably be treated as substantially constant as long as variation within the band serving as the problem is sufficiently flat. Herein, the quantization error is defined as additive noise such as the following.

$$I'_x(t) = I_x(t) + \varphi(t) \tag{52}$$

$$\hat{I}'_x(\omega) = \hat{I}_x(\omega) + \Phi(\omega) \quad (x \in \{a, b, c\})$$

$$\Phi(\omega) = \frac{1}{2\pi} \int_{-\infty}^{\infty} \varphi(t) e^{-i\omega t} dt$$

Herein, $I'_x(t)$ is the time series data of the line current observed after quantization, $I_x(t)$ is the actual time series data of the line current, $\hat{I}'_x(\omega)$ is the spectrum of the line current measured after quantization, and $\hat{I}_x(\omega)$ is the actual spectrum of the line current. $I_x(t)$ and $\hat{I}_x(\omega)$ are unobservable values. Moreover, $\varphi(t)$ is the time series data of the quantization error, and $\Phi(\omega)$ is the spectrum of the quantization error.

In the present exemplary embodiment, the effect of the quantization error is large since the line current values of the high voltage side are measurements of high voltage current. The effect of the quantization error on the phase current caused by power consumption of the consumer is comparatively small and is ignored. However, correction for quantization error may be easily introduced for the latter by treating similarly to the line current.

The power spectrum $|\Phi(\omega)|^2$ is a constant function in cases in which the quantization error $\varphi(t)$ is treated as ideal white noise, and theoretical values thereof are known to accord with Equation (53) below when errors are uniformly distributed within the quantization width (for example, 4[A]).

$$|\Phi(\omega)|^2 = \sigma_\varphi^2 = \frac{\Delta^2}{12} \tag{53}$$

Wherein, $\sigma_\varphi^2$ is the variance in $\varphi(t)$, and $\Delta$ is the quantization width.

Even when the power spectrum $|\Phi(\omega)|^2$ of the quantization error is not a constant function, in cases in which the power spectrum $|\Phi(\omega)|^2$ can be known, the effect of the quantization error on the connection phase determination can, in principle, be eliminated by using the correlation coefficients after correction using $|\Phi(\omega)|^2$. More specifically, when computing Equation (32), the correlation coefficients may be calculated after performing a correction using $|\Phi(\omega)|^2$.

First, a correction like that of Equation (54) below is added to the co-spectrum $K_{xd}(\omega)$ and the autocorrelation function $C_{xx}(0)$ in Equation (32).

$$\int_{-\infty}^{\infty} K_{xd}(\omega) d\omega = \tag{54}$$

$$2 \int_0^\infty \mathrm{Re}[S_{xd}(\omega)] d\omega \sim 2\Delta\omega \sum_{k=0}^{N-1} \mathrm{Re}\left[\left\{\frac{2\pi}{T}(\hat{I}'_x(\omega_k) - \Phi(\omega_k))^* \hat{I}_d(\omega_k)\right\}\right]$$

$$C_{xx}(0) = \int_{-\infty}^{\infty} S_{xx}(\omega) d\omega =$$

$$2 \int_0^\infty S_{xx}(\omega) d\omega \sim 2\Delta\omega \sum_{k=0}^{N-1} \left\{\frac{2\pi}{T}|\hat{I}'_x(\omega_k) - \Phi(\omega_k)|^2\right\}$$

The phase of the spectrum $\Phi(\omega)$ of the quantization error is assumed to be random, and independent from the spectrum of the line current data. In such cases, given that $\langle\Phi\rangle = 0$ and $\langle\Phi\hat{I}\rangle = \langle\Phi\rangle\langle\hat{I}\rangle = 0$, the ensemble averages of Equation (54) can be substituted as in Equation (55) below.

$$\left\langle\frac{2\pi}{T}(\hat{I}'_x(\omega_k) - \Phi(\omega_k))^* \hat{I}_d(\omega_k)\right\rangle = \left\langle\frac{2\pi}{T}\hat{I}'^*_x(\omega_k)\hat{I}_d(\omega_k)\right\rangle \tag{55}$$

$$\left\langle\frac{2\pi}{T}|\hat{I}'_x(\omega_k) - \Phi(\omega_k)|^2\right\rangle = \left\langle\frac{2\pi}{T}(|\hat{I}'_x(\omega_k)|^2 + |\Phi(\omega_k)|^2)\right\rangle$$

When Equation (55) is used in Equation (33), the result of correcting for the effect of the quantization error and computing the correlation coefficient $\rho_{xd}$ between the line current and the phase current corresponding to power consumption by the consumer d is given by Equation (56) below.

$$\rho_{xd} = \frac{1}{\sqrt{C_{xx}(0)}\sqrt{C_{dd}(0)}} \int_{-\infty}^{\infty} K_{xd}(\omega) d\omega \sim \tag{56}$$

$$\frac{2\Delta\omega \sum_{k=0}^{N-1} \mathrm{Re}\left[\left\{\frac{2\pi}{T}(\hat{I}'_x(\omega_k) - \Phi(\omega_k))^* \hat{I}_d(\omega_k)\right\}\right]}{\sqrt{2\Delta\omega \sum_{k=0}^{N-1}\left\{\frac{2\pi}{T}|\hat{I}'_x(\omega_k) - \Phi(\omega_k)|^2\right\}}\sqrt{2\Delta\omega \sum_{k=0}^{N-1}\left\{\frac{2\pi}{T}|\hat{I}_d(\omega_k)|^2\right\}}} =$$

$$\frac{\sum_{k=0}^{N} \mathrm{Re}\left[\langle\hat{I}'^*_x(\omega_k)\hat{I}_d(\omega_k)\rangle\right]}{\sqrt{\sum_{k=0}^{N-1}\langle|\hat{I}'_x(\omega_k)|^2 + |\Phi(\omega_k)|^2\rangle}\sqrt{\sum_{k=0}^{N-1}\langle|\hat{I}_d(\omega_k)|^2\rangle}} \quad (x \in \{a, b, c\})$$

Moreover, in cases in which the fluctuation width of the spectrum of the quantization error can be considered a real-valued constant function ($|\Phi(\omega_k)|=C$), Equation (56) can be simplified to Equation (57) below.

$$\rho_{xd} \sim \frac{\sum_{k=0}^{N-1} \text{Re}\left[\langle \hat{I}_x'^*(\omega_k) I_d(\omega_k) \rangle\right]}{\sqrt{\sum_{k=0}^{N-1} \left(\langle |\hat{I}_x'(\omega_k)|^2 \rangle + C^2\right)} \sqrt{\sum_{k=0}^{N-1} \langle |\hat{I}_d(\omega_k)|^2 \rangle}} \quad (57)$$

$(x \in \{a, b, c\})$

The computation equation for the correlation coefficients becomes like Equation (58) below in cases that also consider a correction for the quantization error in the phase current at the consumer side.

$$\rho_{xd} = \frac{1}{\sqrt{C_{xx}(0)}\sqrt{C_{dd}(0)}} \int_{-\infty}^{\infty} K_{xd}(\omega)\,d\omega \sim \qquad (58)$$

$$\frac{2\Delta\omega \sum_{k=0}^{N-1} \text{Re}\left[\left\langle \frac{2\pi}{T}(\hat{I}_x'(\omega_k) - \Phi_x(\omega_k))^* (\hat{I}_d'(\omega_k) - \Phi_d(\omega_k)) \right\rangle\right]}{\sqrt{2\Delta\omega \sum_{k=0}^{N-1} \left\langle \left|\frac{2\pi}{T}\hat{I}_x'(\omega_k) - \Phi_x(\omega_k)\right|^2 \right\rangle} \sqrt{2\Delta\omega \sum_{k=0}^{N-1} \left\langle \left|\frac{2\pi}{T}\hat{I}_d'(\omega_k) - \Phi_d(\omega_k)\right|^2 \right\rangle}} =$$

$$\frac{\sum_{k=0}^{N-1} \text{Re}\left[\langle \hat{I}_x'^*(\omega_k) \hat{I}_d(\omega_k) \rangle\right]}{\sqrt{\sum_{k=0}^{N-1} \langle |\hat{I}_x'(\omega_k)|^2 + |\Phi_x(\omega_k)|^2 \rangle} \sqrt{\sum_{k=0}^{N-1} \langle |\hat{I}_d(\omega_k)| + |\Phi_d(\omega_k)|^2 \rangle}}$$

$(x \in \{a, b, c\})$

In Equation (58), $|\Phi_x(\omega_k)|^2$ is the power spectrum of the quantization error of the line current, and $|\Phi_d(\omega_k)|^2$ is the power spectrum of the quantization error of the phase current on the consumer side. It is assumed that $\Phi_x(\omega_k)$ and $\Phi_d(\omega_k)$ have random phases, are independent from the spectrum of the line current data, and are mutually independent spectra of quantization error. In such cases, use can be made of the equations $<\Phi_x>=<\Phi_d>=0$, $<\Phi_x \hat{I}^*>=<\Phi_x><\hat{I}^*>=0$, $<\Phi_d \hat{I}^*>=<\Phi_d><\hat{I}^*>=0$, and $<\Phi_x \Phi_d>=<\Phi_x><\Phi_d>=0$.

A specific estimation of the power spectrum $|\Phi(\omega)|^2$ of the quantization error is needed to perform a correction like that described above, and a possible method for this estimation is as follows.
(1) Take a theoretical value such as that of Equation (53).
(2) In cases in which the time series data before and after quantization can be used in order to estimate the power spectrum, $|\Phi(\omega)|^2$ is estimated in the form of a real-valued function or a real-valued constant function from statistical processing of plural samples.

A specific procedure for (2) is described below. In cases in which time series data before and after quantization can be used, the spectrum of the quantization error can be obtained from Equation (59) below obtained from Equation (52).

$$\Phi(\omega) = \frac{1}{2\pi} \int_{-\infty}^{\infty} \varphi(t) e^{-i\omega t}\, dt \qquad (59)$$

where $$\varphi(t) = I_x'(t) - I_x(t)$$

Given that the quantization error is a random signal, the overall segment may be ordinarily divided into several segments, and a spectrum estimated with the ensemble average $<|\Phi(\omega_k)|^2>$ of the power spectrum derived for each segment by, for example, FFT (a direct method) may be employed. Moreover, in cases in which the spectrum is assumed to be a constant function, the constant value may be estimated by then taking an average in the frequency domain as represented by Equation (60) below.

$$C^2 = \frac{1}{N-1} \sum_{k=0}^{N-1} \langle |\Phi(\omega_k)|^2 \rangle \qquad (60)$$

The transformer connection phase determination device 210 may, for example, be implemented by the computer 40 illustrated in FIG. 4. The storage section 43 serving as a recording medium stores a transformer connection phase determination program 250 that causes the computer 40 to function as the transformer connection phase determination device 210. The CPU 41 reads the transformer connection phase determination program 250 from the storage section 43, expands the transformer connection phase determination program 250 into the memory 42, and sequentially executes the processes included in the transformer connection phase determination program 250.

The transformer connection phase determination program 250 includes a consumer selection process 52, a current value computation process 54, a frequency component computation process 56, a quantization error computation process 66, a correlation coefficient computation process 258, a connection phase determination process 60, and an output processing process 62.

The CPU 41 operates as the correlation coefficient computation section 216 illustrated in FIG. 10 by executing the correlation coefficient computation process 258. The CPU 41 operates as the quantization error computation section 36 illustrated in FIG. 10 by executing the quantization error computation process 66. The other processes are similar to those of the transformer connection phase determination program 50 according to the first exemplary embodiment. The computer 40 that executes the transformer connection phase determination program 250 thereby functions as the transformer connection phase determination device 210.

Note that the transformer connection phase determination device 210 may be implemented with, for example, a semiconductor integrated circuit, and more specifically with an ASIC or the like.

Figure 11:
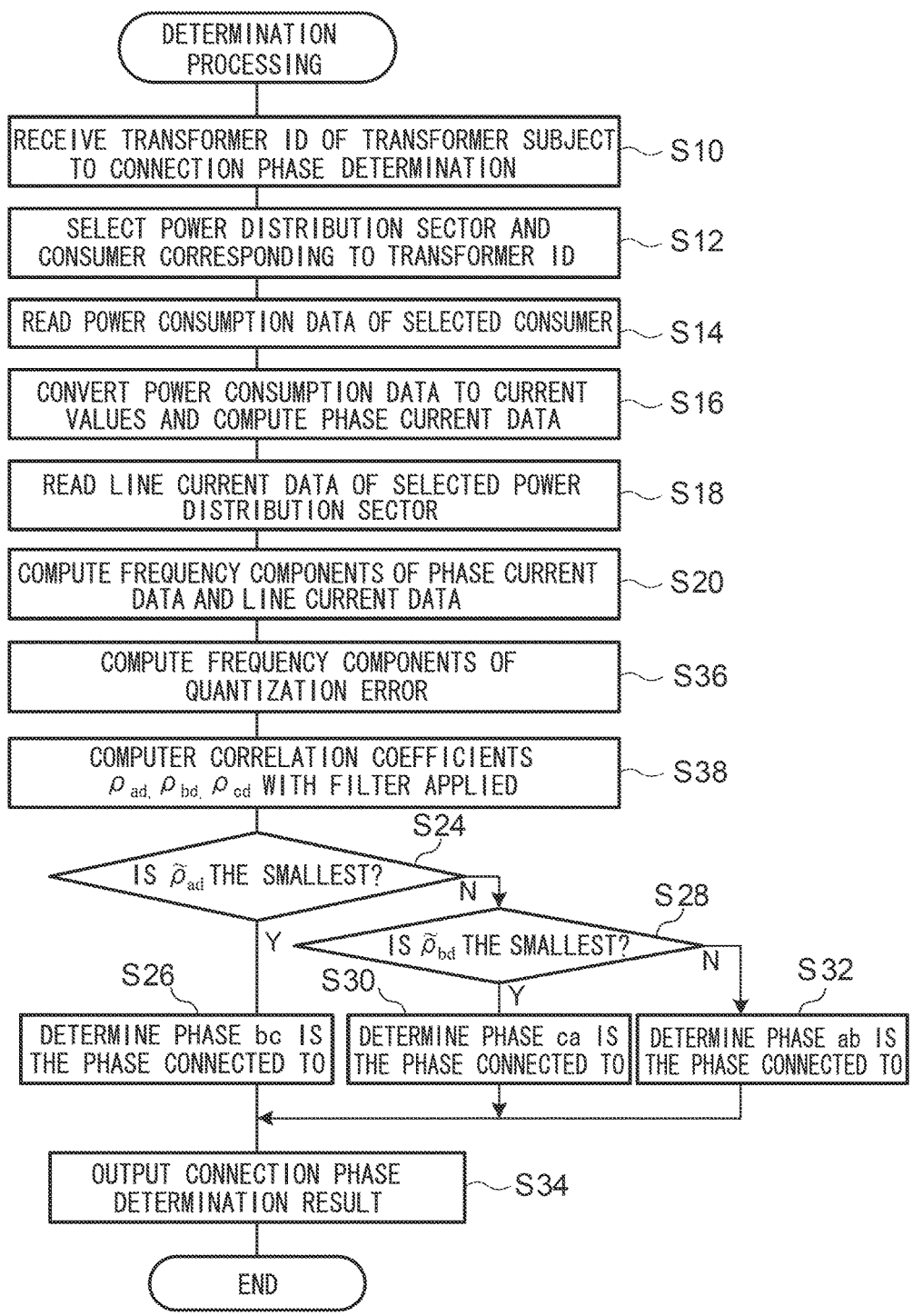
FIG. 11 is a flowchart illustrating an example of determination processing in the second exemplary embodiment.

Operation of the Transformer Connection Phase Determination Device According to the Second Exemplary Embodiment Explanation follows regarding operation of the transformer connection phase determination device 210 according to the second exemplary embodiment. The determination processing illustrated in FIG. 11 is executed by the transformer connection phase determination device 210. Note that processing similar to that of the determination processing of the first exemplary embodiment (see FIG. 5) is allocated the same reference numerals and explanation thereof is omitted.

The spectrum I'^$_x$(ω) of the line current and the spectrum I^$_d$(ω) of the phase current caused by power consumption of the consumer d are computed at steps S10 to S20 of the determination processing illustrated in FIG. 1, similarly to in the first exemplary embodiment. Next, at step S36, the quantization error computation section 36 computes the spectrum of the quantization error Φ(ω) using Equation (53), Equation (59), or Equation (60).

Next, at step S38, the correlation coefficient computation section 216 computes the correlation coefficient $\rho_{xd}$ using the respective spectra of the phase current and the line current computed at step S20, and the spectrum of the quantization error computed at step S36. More specifically, the correlation coefficient computation section 216 computes the correlation coefficient $\rho_{xd}$ according to Equation (56), Equation (57), or Equation (51), using the spectrum I'^$_x$(ω) of the line current, the spectrum I^$_d$(ω) of the phase current caused by power consumption of the consumer d, and the spectrum Φ(ω) of the quantization error.

Similarly to in the determination processing of the first exemplary embodiment, at steps S24 to S34, the transformer connection phase is determined using the correlation coefficients $\rho^\sim_{xd}$. Note that $\rho^\sim_{ad}$ at step S24 may be read as $\rho_{ad}$, and $\rho^\sim_{bd}$ at step S28 may be read as $\rho_{bd}$.

As explained above, in the transformer connection phase determination device 210 according to the second exemplary embodiment, the transformer connection phase can be determined even in cases in which the power consumption data can only be used for a portion of the consumers connected to the transformer, similarly to in the first exemplary embodiment. Moreover, the quantization error can be computed, and correction can be made for the effect of the quantization error when determining the connection phase. Similarly to in the computation of the correlation coefficients, the quantization error itself does not need to be corrected in the time domain since the quantization error is also computed using the frequency components.

In both the first exemplary embodiment and the second exemplary embodiment, the data of the respective line currents of the distribution lines on the high voltage side of the power distribution system can be derived from measurement values measured by the sensor containing switches. Moreover, the power consumption data of the consumers may, for example, employ measurement values measured by power meters with communication functions, such as smart meters, installed at the consumer. In this manner, the transformer connection phase can be determined using only data measured by sensor containing switches and power meters with communication functions.

Note that in the second exemplary embodiment, similarly to in the first exemplary embodiment, correlation coefficients may be computed with an optimum filter applied in order to increase the determination precision. In cases in which quantization error effect are corrected for, the filter to be applied will generally be a filter that has different characteristics depending on whether the filter is employed before or after correcting for quantization error effects. Thus, in order to achieve filter optimization for data before and after correcting for quantization error effects, as indicated by Equation (61), addition of a correction using Equation (54) to the difference of the normalized randomized variable co-spectrum is needed.

$$A(\omega_k) = \frac{K_{x2d}(\omega_k)}{C_{x2}(0)C_d(0)} - \frac{K_{x1d}(\omega_k)}{C_{x1}(0)C_d(0)} \quad (61)$$

As a result of adding the correction, Equation (62) below is obtained when Φ($\omega_k$) is treated as an general real-valued function, and Equation (63) below is obtained by taking Φ($\omega_k$) to be a real-valued constant function (|Φ($\omega_k$)|² = C² ∈ real numbers).

$$A(\omega_k) = \frac{\sum_{k=0}^{N-1} \text{Re}[\langle \hat{I}'^*_{x2}(\omega_k) \hat{I}_d(\omega_k) \rangle]}{\sqrt{\sum_{k=0}^{N-1} \langle |\hat{I}'_{x2}(\omega_k)|^2 + |\Phi(\omega_k)|^2 \rangle} \sqrt{\sum_{k=0}^{N-1} \langle |\hat{I}_d(\omega_k)|^2 \rangle}} - \frac{\sum_{k=0}^{N-1} \text{Re}[\langle \hat{I}'^*_{x1}(\omega_k) \hat{I}_d(\omega_k) \rangle]}{\sqrt{\sum_{k=0}^{N-1} \langle |\hat{I}'_{x1}(\omega_k)|^2 + |\Phi(\omega_k)|^2 \rangle} \sqrt{\sum_{k=0}^{N-1} \langle |\hat{I}_d(\omega_k)|^2 \rangle}} \quad (62)$$

$$A(\omega_k) = \frac{\sum_{k=0}^{N-1} \text{Re}[\langle \hat{I}'^*_{x2}(\omega_k) \hat{I}_d(\omega_k) \rangle]}{\sqrt{\sum_{k=0}^{N-1} (\langle |\hat{I}'_{x2}(\omega_k)|^2 \rangle + C^2)} \sqrt{\sum_{k=0}^{N-1} \langle |\hat{I}_d(\omega_k)|^2 \rangle}} - \frac{\sum_{k=0}^{N-1} \text{Re}[\langle \hat{I}'^*_{x1}(\omega_k) \hat{I}_d(\omega_k) \rangle]}{\sqrt{\sum_{k=0}^{N-1} (\langle |\hat{I}'_{x1}(\omega_k)|^2 \rangle + C^2)} \sqrt{\sum_{k=0}^{N-1} \langle |\hat{I}_d(\omega_k)|^2 \rangle}} \quad (63)$$

When the optimum filter is derived after correcting for quantization error effects, the optimization problem of Equation (49) may be solved by generating the above values using statistical quantities from samples derived for plural consumers.

Based on the result of Equation (62) or Equation (63), a frequency response characteristic $b^\sim_k$ of the optimum filter characteristic vector $b^\sim$ (characteristic vector $b^\sim = b^\sim_0, \ldots, b^\sim_{N-1})^T$) obtained by solving the problem of Equation (49) is employed in connection phase determination. More specifically, the computation equation of the correlation coefficient of Equation (50) or Equation (51) may be rewritten so as to correct for quantization error effects, thereby yielding Equation (64) or Equation (65) below.

$$\tilde{\rho}_{xd} = \sum_{k=0}^{N-1} \tilde{b}_k NK_{xd}(\omega_k) \ (x \in \{a, b, c\}) \quad (64)$$

where

-continued $$NK_{xd}(\omega_k) = \frac{\text{Re}[\langle \hat{I}_x'^{*}(\omega_k)\hat{I}_d(\omega_k)\rangle]}{\sqrt{\sum_{k=0}^{N-1}\langle|\hat{I}_x'(\omega_k)|^2 + |\Phi(\omega_k)|^2\rangle}\sqrt{\sum_{k=0}^{N-1}\langle|\hat{I}_d(\omega_k)|^2\rangle}} \quad (65)$$

$$\tilde{\rho}_{xd} = \frac{\sum_{k=0}^{N-1}\tilde{b}_k^2\text{Re}[\langle \hat{I}_x'^{*}(\omega_k)\hat{I}_d(\omega_k)\rangle]}{\sqrt{\sum_{k=0}^{N-1}\tilde{b}_k^2\langle|\hat{I}_x'(\omega_k)|^2 + |\Phi(\omega_k)|^2\rangle}\sqrt{\sum_{k=0}^{N-1}\tilde{b}_k^2\langle|\hat{I}_d(\omega_k)|^2\rangle}}$$

$(x \in \{a, b, c\})$

In the connection phase determination, determination may be made similarly to in the first exemplary embodiment using the correlation coefficient $\tilde{\rho}_{xd}$ of Equation (64) or Equation (65).

As described above, computation of the correlation coefficients that serve as a reference for the transformer connection phase determination is implemented using only data of frequency bands, rather than data of time bands, and can be implemented as follows.

(1) Optimize the digital filter that targets general function system.
(2) Increase precision of the final connection phase determination by reducing the effect of quantization error accompanying current measurements to the calculation of the correlation coefficients.

Moreover, embodiments are explained above in which the transformer connection phase determination program 50, 250 is pre-stored (installed) in the storage section 43. However, it is possible to provide the image processing program of technology disclosed herein stored on a storage medium such as a CD-ROM or DVD-ROM.

Related technology needs power consumption data for all of the consumers connected to the transformer, and is not able to determine the connection phase to the transformer when power consumption amount data is only usable for a portion of the consumers.

One aspect of technology disclosed herein exhibits an advantage effect of enabling determination of a transformer connection phase even in cases in which it is only possible to use power consumption amount data for a portion of the consumers connected to the transformer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transformer connection phase determination device, comprising:
    a processor configured to execute a process, the process comprising:
        acquiring a first time series data of a power value or a current value caused by the power value consumed by at least one consumer connected to a transformer that is connected to a phase corresponding to a combination of two of a plurality of distribution lines, and acquiring a second time series data of respective current values flowing in the plurality of distribution lines;
        computing a frequency component of the first time series data of the power value or of the current value caused by the power value, and a frequency component of the second time series data of the respective current values flowing in the plurality of distribution lines by applying a Fourier transform to each of the first time series data and the second time series data;
        computing respective correlation values indicating a correlation between the first time series data of the power value or the current value caused by the power value and the second time series data of the respective current values flowing in the plurality of distribution lines, using each of the computed frequency components, and determining the phase to which the transformer is connected based on the respective correlation values,
    wherein, in the process, during the computation of the correlation values, a filter is applied that has been optimized so as to increase a degree of reliability based on differences between the correlation values, and each of the correlation values is computed, and
        defining the degree of reliability using a probability variable based on a plurality of correlation values obtained from respective frequency components of current values caused by power values consumed by a plurality of consumers; and
        in cases in which an average value of output is constant when the filter is multiplied by the probability variable, optimizing the filter so as to minimize a variance value of the output by using a convex quadratic program employing the average, variance, and covariance of the probability variable.

2. The transformer connection phase determination device of claim 1, wherein, in the process, the degree of reliability is an indicator based on a difference between a first correlation value representing a lowest correlation among the respective correlation values, and a second correlation value representing a second lowest correlation among the respective correlation values or an average of the correlation values other than the first correlation value among the respective correlation values.

3. The transformer connection phase determination device of claim 1, wherein the process further comprises:
    computing frequency components of quantization error in the first time series data of the power value or the current value caused by the power value, or in the second time series data of the respective current values flowing in the plurality of power distribution lines, or in a combination thereof; and
    computing a correlation value corrected for the effect of the computed quantization error during the computation of the correlation value.

4. The transformer connection phase determination device of claim 3, wherein, in the process, during computation of the quantization error, a theoretical value that has assumed that the quantization error is uniformly distributed across a quantization width, or an estimated value obtained by statistical processing of a plurality of samples of current values before and after quantization, is computed as the quantization error.

5. A transformer connection phase determination method, comprising:
  acquiring a first time series data of a power value or a current value caused by the power value consumed by at least one consumer connected to a transformer that is connected to a phase corresponding to a combination of two of a plurality of distribution lines, and acquiring a second time series data of respective current values flowing in the plurality of distribution lines;
  computing a frequency component of the first time series data of the power value or of the current value caused by the power value, and a frequency component of the second time series data of the respective current values flowing in the plurality of distribution lines by applying a Fourier transform to each of the first time series data and the second time series data;
  computing respective correlation values indicating a correlation between the first time series data of the power value or the current value caused by the power value and the second time series data of the respective current values flowing in the plurality of distribution lines, using each of the computed frequency components, and, by a processor, determining the phase to which the transformer is connected based on the respective correlation values,
  wherein, during the computation of the correlation values, a filter is applied that has been optimized so as to increase a degree of reliability based on differences between the correlation values, and each of the correlation values is computed, and
  defining the degree of reliability using a probability variable based on a plurality of correlation values obtained from respective frequency components of current values caused by power values consumed by a plurality of consumers; and
  in cases in which an average value of output is constant when the filter is multiplied by the probability variable, optimizing the filter so as to minimize a variance value of the output by using a convex quadratic program employing the average, variance, and covariance of the probability variable.

6. The transformer connection phase determination method of claim 5, wherein the degree of reliability is an indicator based on a difference between a first correlation value representing a lowest correlation among the respective correlation values, and a second correlation value representing a second lowest correlation among the respective correlation values or an average of the correlation values other than the first correlation value among the respective correlation values.

7. The transformer connection phase determination method of claim 5, further comprising:
  computing frequency components of quantization error in the first time series data of the power value or the current value caused by the power value, or in the second time series data of the respective current values flowing in the plurality of power distribution lines, or in a combination thereof; and
  computing a correlation value corrected for the effect of the computed quantization error during the computation of the correlation value.

8. The transformer connection phase determination method of claim 7, wherein during computation of the quantization error, a theoretical value that has assumed that the quantization error is uniformly distributed across a quantization width, or an estimated value obtained by statistical processing of a plurality of samples of current values before and after quantization, is computed as the quantization error.

9. A non-transitory recording medium storing a program that causes a computer to execute a transformer connection phase determination process, the process comprising:
  acquiring a first time series data of a power value or a current value caused by the power value consumed by at least one consumer connected to a transformer that is connected to a phase corresponding to a combination of two of a plurality of distribution lines, and acquiring a second time series data of respective current values flowing in the plurality of distribution lines;
  computing a frequency component of the first time series data of the power value or of the current value caused by the power value, and a frequency component of the second time series data of the respective current values flowing in the plurality of distribution lines by applying a Fourier transform to each of the first time series data and the second time series data;
  computing respective correlation values indicating a correlation between the first time series data of the power value or the current value caused by the power value and the second time series data of the respective current values flowing in the plurality of distribution lines, using each of the computed frequency components, and determining the phase to which the transformer is connected based on the respective correlation values,
  wherein, in the transformer connection phase determination process, during the computation of the correlation values, a filter is applied that has been optimized so as to increase a degree of reliability based on differences between the correlation values, and each of the correlation values is computed,
  defining the degree of reliability using a probability variable based on a plurality of correlation values obtained from respective frequency components of current values caused by power values consumed by a plurality of consumers; and
  in cases in which an average value of output is constant when the filter is multiplied by the probability variable, optimizing the filter so as to minimize a variance value of the output by using a convex quadratic program employing the average, variance, and covariance of the probability variable.

10. The non-transitory recording medium of claim 9, wherein in the transformer connection phase determination process, the degree of reliability is an indicator based on a difference between a first correlation value representing a lowest correlation among the respective correlation values, and a second correlation value representing a second lowest correlation among the respective correlation values or an average of the correlation values other than the first correlation value among the respective correlation values.

11. The non-transitory recording medium of claim 9, the transformer connection phase determination process further comprising:
  computing frequency components of quantization error in the first time series data of the power value or the current value caused by the power value, or in the second time series data of the respective current values flowing in the plurality of power distribution lines, or in a combination thereof; and
  computing a correlation value corrected for the effect of the computed quantization error during the computation of the correlation value.

12. The non-transitory recording medium of claim 11, wherein, in the transformer connection phase determination process, during computation of the quantization error, a theoretical value that has assumed that the quantization error is uniformly distributed across a quantization width, or an estimated value obtained by statistical processing of a plurality of samples of current values before and after quantization, is computed as the quantization error.

* * * * *